United States Patent
Zhang et al.

(10) Patent No.: US 9,327,348 B2
(45) Date of Patent: *May 3, 2016

(54) NANOWIRE PREPARATION METHODS, COMPOSITIONS, AND ARTICLES

(76) Inventors: Junping Zhang, Saint Paul, MN (US); David R. Whitcomb, Woodbury, MN (US)

(*) Notice: Subject to any disclaimer, the term of this patent is extended or adjusted under 35 U.S.C. 154(b) by 783 days.

This patent is subject to a terminal disclaimer.

(21) Appl. No.: 13/442,949

(22) Filed: Apr. 10, 2012

(65) Prior Publication Data

US 2012/0294755 A1 Nov. 22, 2012

Related U.S. Application Data

(63) Continuation-in-part of application No. 13/110,977, filed on May 19, 2011.

(60) Provisional application No. 61/415,952, filed on Nov. 22, 2010, provisional application No. 61/429,595, filed on Jan. 4, 2011, provisional application No. 61/488,930, filed on May 23, 2011, provisional application No. 61/494,111, filed on Jun. 7, 2011.

(51) Int. Cl.
| | |
|---|---|
| *B22F 1/00* | (2006.01) |
| *B22F 9/24* | (2006.01) |
| *B82Y 30/00* | (2011.01) |
| *C30B 29/60* | (2006.01) |
| *C30B 7/14* | (2006.01) |
| *C30B 29/02* | (2006.01) |
| *B22F 9/18* | (2006.01) |

(52) U.S. Cl.
CPC ................ *B22F 1/0025* (2013.01); *B22F 9/24* (2013.01); *B82Y 30/00* (2013.01); *C30B 7/14* (2013.01); *C30B 29/02* (2013.01); *C30B 29/60* (2013.01)

(58) Field of Classification Search
CPC ............ B22F 1/00; B22F 9/18; C30B 29/02; C30B 29/60; C30B 7/14
USPC .................................... 420/591; 75/711, 392
See application file for complete search history.

(56) References Cited

U.S. PATENT DOCUMENTS

| | | | |
|---|---|---|---|
| 2004/0086646 A1 | 5/2004 | Brandes et al. | |
| 2006/0068025 A1 | 3/2006 | Chang et al. | |
| 2009/0196788 A1* | 8/2009 | Wang et al. | 420/501 |
| 2010/0002282 A1 | 1/2010 | Agrawal et al. | |

OTHER PUBLICATIONS

International Search Report, International Application No. PCT/US2011/048166, dated Oct. 31, 2011, 2 pages.

M.A. Kostowskyj, et al., "Silver nanowire catalysts for alkaline fuel cells," International Journal of Hydrogen Energy, 2008, vol. 33, No. 2, pp. 5773-5778.

Chang Chen et al., Study on the synthesis of silver nanowires with adjustable diameters through the Polyol process, Nanotechnology 17 (2006), pp. 3933-3938.

(Continued)

*Primary Examiner* — Rebecca Lee

(57) ABSTRACT

Preparation methods, compositions, and articles useful for electronic and optical applications are disclosed. Such methods reduce metal ions to metal nanowires in the presence of bromide ions, IUPAC Group 14 elements in their +2 oxidation state, and optionally chloride ions. The product nanowires are useful in electronics applications.

8 Claims, 33 Drawing Sheets

(56) References Cited

OTHER PUBLICATIONS

Benjamin J. Wiley et al., Synthesis and Electrical Characterization of Silver Nanobeams, Nano Letters (2006), vol. 6, No. 10, pp. 2273-2278.

Dapeng Chen et al., Morphology-controlled synthesis of silver nanostructures via a solvothermal method, J Mater Sci: Mater Electron (2011), pp. 1335-1339.

* cited by examiner

NANOWIRE PREPARATION METHODS, COMPOSITIONS, AND ARTICLES

CROSS REFERENCE TO RELATED APPLICATIONS

This application is a continuation-in-part of U.S. application Ser. No. 13/110,977, filed May 19, 2011, entitled NANOWIRE PREPARATION METHODS, COMPOSITIONS, AND ARTICLES, which is hereby incorporated by reference in its entirety, which claimed priority to U.S. Provisional Application No. 61/415,952, filed Nov. 22, 2010, entitled METAL ION CATALYSIS OF AgNW FORMATION, which is hereby incorporated by reference in its entirety, and to U.S. Provisional Application No. 61/429,595, filed Jan. 4, 2011, entitled METAL ION CATALYSIS OF METAL ION REDUCTION, METHODS, COMPOSITIONS, AND ARTICLES, which is hereby incorporated by reference in its entirety.

This application also claims the benefit of U.S. Provisional Application No. 61/488,930, filed May 23, 2011, entitled NANOWIRE PREPARATION METHODS, COMPOSITIONS, AND ARTICLES, which is hereby incorporated by reference in its entirety, and of U.S. Provisional Application. No. 61/494,111, filed Jun. 7, 2011, entitled NANOWIRE PREPARATION METHODS, COMPOSITIONS, AND ARTICLES, which is hereby incorporated by reference in its entirety.

BACKGROUND

The general preparation of silver nanowires (10-200 aspect ratio) is known. See, for example, *Angew. Chem. Int. Ed.* 2009, 48, 60, Y. Xia, Y. Xiong, B. Lim, S. E. Skrabalak, which is hereby incorporated by reference in its entirety. Such preparations typically employ $Fe^{2+}$ or $Cu^{2+}$ ions to "catalyze" the wire formation over other morphologies. The controlled preparation of silver nanowires having the desired lengths and widths, however, is not known. For example, the $Fe^{2+}$ produces a wide variety of lengths or thicknesses and the $Cu^{2+}$ produces wires that are too thick for many applications.

When iron or copper are used, they are typically provided as the metal halide salts $FeCl_2$ or $CuCl_2$. See, for example, B. Wiley et al., *Nano Letters,* 2004, 4, 1733-1739 and K. E. Korte et al., *J. Mats. Chem.,* 2008, 18, 437. Other metal halide salts have been used in nanowire synthesis. See, for example, J. Jiu, K. Murai, D. Kim, K. Kim, K. Suganuma, *Mat. Chem. & Phys.,* 2009, 114, 333, which refers to $NaCl$, $CoCl_2$, $CuCl_2$, $NiCl_2$ and $ZnCl_2$, and S. Nandikonda, "Microwave Assisted Synthesis of Silver Nanorods," M.S. Thesis, Auburn University, Auburn, Ala., USA, Aug. 9, 2010, which refers to $NaCl$, $KCl$, $MgCl_2$, $CaCl_2$, $MnCl_2$, $CuCl_2$, and $FeCl_3$, and Japanese patent application publication 2009-155674, which discloses $SnCl_4$. See also S. Murali et al., *Langmuir,* 2010, 26(13), 11176-83; Z. C. Li et al., *Micro & Nano Letters,* 2011, 6(2), 90-93; and B. J. Wiley et al., *Langmuir,* 2005, 21, 8077. Japanese patent application publication 2009-155674 discloses $SnCl_4$.

Use of KBr has been disclosed in, for example, D. Chen et al., *J. Mater. Sci.: Mater. Electron.,* 2011, L. Hu et al., *ACS Nano,* 2010, 4(5), 2955-2963, C. Chen et al, *Nanotechnology,* 2006, 17, 3933. Use of NaBr has been disclosed in, for example, L. Zhou et al., *Appl. Phys. Letters,* 2009, 94, 153102.

SUMMARY

At least a first embodiment provides methods comprising providing at least one first composition comprising at least one first reducible metal ion, and reducing the at least one first reducible metal ion to at least one first metal in the presence of at least one second metal ion comprising at least one IUPAC Group 14 element in its +2 oxidation state.

In such methods, the at least one first reducible metal ion may, for example, comprise at least one coinage metal ion, or at least one ion of an IUPAC Group 11 element, such as, for example, at least one silver ion. In at least some embodiments, the at least one first composition comprises silver nitrate.

In such methods, the at least one second metal ion may, for example, comprise tin in its +2 oxidation state, or it may, for example, comprise germanium in its +2 oxidation state, or it may, for example, comprise both tin in its +2 oxidation state and germanium in its +2 oxidation state.

In such methods, the reduction of the first reducible metal ion may, in some cases, occur in the presence some or all of at least one halide ion, at least one protecting agent, or at least one polyol.

Some embodiments provide products comprising the at least one first metal produced by such methods. In some cases, such products may comprise at least one metal nanowire.

Other embodiments provide articles comprising such products.

Still other embodiments provide compositions comprising at least one metal nanowire and at least one ion of an IUPAC Group 14 element. In some cases, the at least one metal nanowire comprises at least one silver nanowire. Such a metal nanowire may, for example, comprise a smallest dimension between about 10 nm and about 300 nm. Or such a metal nanowire may, for example, comprise an aspect ratio between about 50 and about 10,000.

Yet still other embodiments provide products comprising such metal nanowires or articles comprising such products. Non-limiting examples of such articles include electronic displays, touch screens, portable telephones, cellular telephones, computer displays, laptop computers, tablet computers, point-of-purchase kiosks, music players, televisions, electronic games, electronic book readers, transparent electrodes, solar cells, light emitting diodes, other electronic devices, medical imaging devices, medical imaging media, and the like.

At least a second embodiment provides methods comprising providing at least one first composition comprising at least one first reducible metal ion; and reducing the at least one first reducible metal ion to at least one first metal nanowire in the presence of at least one bromide ion and at least one second metal ion comprising at least one ion of an IUPAC Group 14 element.

In at least some such methods, the at least one first reducible metal ion comprises at least one of a coinage metal ion, an ion of an IUPAC Group 11 element, or a silver ion.

In at least some such methods, the at least one second metal ion is in its +2 oxidation state, or the at least one second metal ion comprises an ion of tin or an ion of germanium.

In at least some such methods, the reducing occurs in the presence of at least one chloride ion. For example, some such methods further comprise providing a first compound comprising at least one chlorine atom and at least one second compound comprising at least one bromine atom, wherein the molar ratio of the at least one chlorine atom to the at least one bromine atom is at least about 4.4 and less than about 76.8.

Other examples of such methods further comprise providing a first compound comprising at least one chlorine atom and at least one second compound comprising at least one bromine atom, wherein the molar ratio of the at least one chlorine atom to the at least one bromine atom is at least about 4.8 and less than abut 6.2.

Other embodiments provide the at least one first metal nanowire produced by any of these methods. In some cases, the at least one metal nanowire comprises at least one silver nanowire. Such a metal nanowire may, for example, comprise a smallest dimension between about 10 nm and about 100 nm.

These embodiments and other variations and modifications may be better understood from the brief description of the drawings, description, examples, exemplary embodiments, figures, and claims that follow. Any embodiments provided are given only by way of illustrative example. Other desirable objectives and advantages inherently achieved may occur or become apparent to those skilled in the art. The invention is defined by the appended claims.

DESCRIPTION

Figure 1:
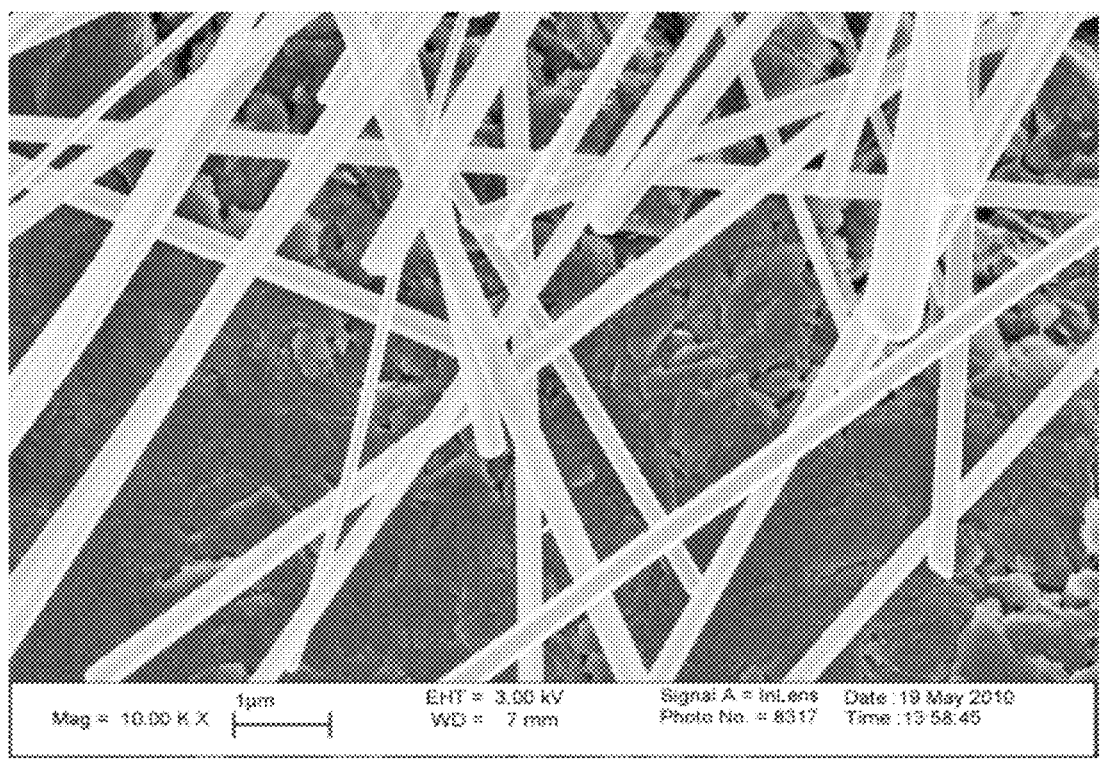
FIG. 1 shows a micrograph of the purified product of Comparative Example 1.

All publications, patents, and patent documents referred to in this document are incorporated by reference herein in their entirety, as though individually incorporated by reference.

U.S. Provisional Application No. 61/415,952, filed Nov. 22, 2010, U.S. Provisional Application No. 61/429,595, filed Jan. 4, 2011, U.S. application Ser. No. 13/110,977, filed May 19, 2011, U.S. Provisional Application No. 61/488,930, filed May 23, 2011, and U.S. Provisional Application No. 61/494, 111, filed Jun. 7, 2011, are all hereby incorporated by reference in their entirety.

Reducible Metal Ions and Metal Products

Some embodiments provide methods comprising reducing at least one reducible metal ion to at least one metal. A reducible metal ion is a cation that is capable of being reduced to a metal under some set of reaction conditions. In such methods, the at least one first reducible metal ion may, for example, comprise at least one coinage metal ion. A coinage metal ion is an ion of one of the coinage metals, which include copper, silver, and gold. Or such a reducible metal ion may, for example, comprise at least one ion of an IUPAC Group 11 element. IUPAC Group 11 elements are sometimes referred to as Group IB elements, based on historic nomenclature. An exemplary reducible metal ion is a silver cation. Such reducible metal ions may, in some cases, be provided as salts. For example, silver cations might, for example, be provided as silver nitrate.

In such embodiments, the at least one metal is that metal to which the at least one reducible metal ion is capable of being reduced. For example, silver would be the metal to which a silver cation would be capable of being reduced.

Nanostructures, Nanostructures, and Nanowires

In some embodiments, the metal product formed by such methods is a nanostructure, such as, for example, a one-dimensional nanostructure. Nanostructures are structures having at least one "nanoscale" dimension less than 300 nm, and at least one other dimension being much larger than the nanoscale dimension, such as, for example, at least about 10 or at least about 100 or at least about 200 or at least about 1000 times larger. Examples of such nanostructures are nanorods, nanowires, nanotubes, nanopyramids, nanoprisms, nanoplates, and the like. "One-dimensional" nanostructures have one dimension that is much larger than the other two dimensions, such as, for example, at least about 10 or at least about 100 or at least about 200 or at least about 1000 times larger.

Such one-dimensional nanostructures may, in some cases, comprise nanowires. Nanowires are one-dimensional nanostructures in which the two short dimensions (the thickness dimensions) are less than 300 nm, preferably less than 100 nm, while the third dimension (the length dimension) is greater than 1 micron, preferably greater than 10 microns, and the aspect ratio (ratio of the length dimension to the larger of the two thickness dimensions) is greater than five. Nanowires are being employed as conductors in electronic devices or as elements in optical devices, among other possible uses. Silver nanowires are preferred in some such applications.

Such methods may be used to prepare nanostructures other than nanowires, such as, for example, nanocubes, nanorods, nanopyramids, nanotubes, and the like. Nanowires and other nanostructure products may be incorporated into articles, such as, for example, electronic displays, touch screens, portable telephones, cellular telephones, computer displays, laptop computers, tablet computers, point-of-purchase kiosks, music players, televisions, electronic games, electronic book readers, transparent electrodes, solar cells, light emitting diodes, other electronic devices, medical imaging devices, medical imaging media, and the like.

Preparation Methods

A common method of preparing nanostructures, such as, for example, nanowires, is the "polyol" process. Such a process is described in, for example, *Angew. Chem. Int. Ed.* 2009, 48, 60, Y. Xia, Y. Xiong, B. Lim, S. E. Skrabalak, which is hereby incorporated by reference in its entirety. Such processes typically reduce a metal cation, such as, for example, a silver cation, to the desired metal nanostructure product, such as, for example, a silver nanowire. Such a reduction may be carried out in a reaction mixture that may, for example, comprise one or more polyols, such as, for example, ethylene glycol (EG), propylene glycol, butanediol, glycerol, sugars, carbohydrates, and the like; one or more protecting agents, such as, for example, polyvinylpyrrolidinone (also known as polyvinylpyrrolidone or PVP), other polar polymers or copolymers, surfactants, acids, and the like; and one or more metal ions. These and other components may be used in such reaction mixtures, as is known in the art. The reduction may, for example, be carried out at one or more temperatures from about 120° C. to about 190° C.

IUPAC Group 14 Metal Ions

In some embodiments, the reduction of the reducible metal ion occurs in the presence of at least one second metal ion comprising at least one IUPAC Group 14 element in its +2 oxidation state. IUPAC Group 14 elements are also sometimes referred to as Group IV elements, based on historic nomenclature.

Not all oxidation states are catalytically active. Applicants have determined that the Group 14 element tin in its +4 oxidation state does not appear to be effective for silver nanowire synthesis, as shown in Comparative Examples 2 and 3. By contrast, Applicants have discovered that Group 14 elements in their +2 oxidation state, such as, for example, tin as $Sn^{2+}$ and germanium as $Ge^{2+}$, can be used to prepare silver nanowires, with desirable control of thickness, or length, or both, relative to conventional preparation using $Fe^{2+}$ or $Cu^{2+}$, and often with minimal nanoparticle contamination.

Bromide Ions and IUPAC Group 14 Metal Ions

In some embodiments, the reduction of the reducible metal ion occurs in the presence of at least one bromide ion and at least one second metal ion comprising at least one IUPAC Group 14 element. Such a reduction may, for example, occur in the presence of tin (II) bromide. Or, in some cases, the reduction may occur in the presence of tin (II) chloride and potassium bromide. Other halides may also optionally be present. For example, the reduction may be carried out in the presence of tin (II) bromide and sodium chloride.

It is envisioned that such reductions may be carried out in the presence of tin in other oxidation states, such as, for example, a +4 oxidation state. It is also envisioned that such reductions may be carried out in the presence of ions of other IUPAC Group 14 elements, such as, for example, germanium, in their various oxidation states.

By reducing the reducible metal ion in the presence of at least one bromide ion and at least one second metal ion comprising at least one IUPAC Group 14 element, such products as ultra-thin nanowires may be produced. Such methods may, for example, be used to produce silver nanowires having a smallest dimension between about 10 nm and about 300 nm, or between about 30 nm and about 80 nm.

Chloride Ions, Bromide Ions and IUPAC Group 14 Metal Ions

In some embodiments, the reduction of the reducible metal ion occurs in the presence of at least one chloride ion, at least one bromide ion, and at least one second metal ion comprising at least one IUPAC Group 14 element. Such a reduction may, for example, occur in the presence of tin (II) chloride and potassium bromide. Or, for example, the reduction may be carried out in the presence of tin (II) bromide and sodium chloride. In some cases, the at least one chloride ion may, for example, be provided by potassium chloride or $NH_nR_{4-n}Cl$, for n=1 or 2 or 3 or 4, where R may be an alkyl group or a substituted alkyl group. In other cases, the at least one bromide ion may, for example, be provided by sodium bromide or $NH_nR_{4-n}Br$, for n=1 or 2 or 3 or 4, where R may be an alkyl group or a substituted alkyl group. These and other sources of chloride ions and bromide ions will be understood by those skilled in the art.

It is envisioned that such reductions may be carried out in the presence of tin in other oxidation states, such as, for example, a +4 oxidation state. It is also envisioned that such reductions may be carried out in the presence of ions of other IUPAC Group 14 elements, such as, for example, germanium, in their various oxidation states.

By reducing the reducible metal ion in the presence of at least one chloride ion, at least one bromide ion, and at least one second metal ion comprising at least one IUPAC Group 14 element, such products as ultra-thin nanowires may be produced. Such methods may, for example, be used to produce silver nanowires having a smallest dimension between about 10 nm and about 100 nm, or between about 15 nm and about 80 nm. Such nanowires may have lengths of, for example, 30 microns or longer.

In at least some embodiments, the reduction is carried out in the presence of sodium chloride and tin (II) bromide, where the sodium chloride and the tin (II) bromide are present in relative molar amounts from about 4.8 to about 6.2. When using such relative molar amounts, ultra-thin nanowires may be made with little non-nanowire contamination. However, when using relative molar amounts less than about 4.4 or greater than about 76.8, the amount of thicker nanowires and non-nanowire contamination may increase.

EXEMPLARY EMBODIMENTS

U.S. Provisional Application No. 61/415,952, filed Nov. 22, 2010, and U.S. Provisional Application No. 61/429,595, filed Jan. 4, 2011, disclose the following exemplary non-limiting embodiments.

In embodiment 1, there is described a method comprising: (a) providing a composition comprising: at least one compound comprising Ag(I), at least one salt of at least one Group IV element, at least one protecting agent, and at least one solvent; and (b) reducing the Ag(I) to silver metal.

Further to the method of embodiment 1, the at least one compound comprises silver nitrate.

Further to the method of embodiment 1, the at least one salt comprises the at least one Group IV element in its +2 valence state.

Further to the method of embodiment 1, the at least one salt comprises at least one chloride.

Further to the method of embodiment 1, the at least one salt comprises stannous chloride or a hydrate of stannous chloride.

Further to the method of embodiment 1, the at least one Group IV element comprises tin.

Further to the method of embodiment 1, the at least one protecting agent comprises at least one of: one or more surfactants, one or more acids, or one or more polar polymers.

Further to the method of embodiment 1, the at least one protecting agent comprises polyvinylpyrrolidinone.

Further to the method of embodiment 1, the at least one solvent comprises at least one polyol.

Further to the method of embodiment 1, the at least one solvent comprises at least one of: ethylene glycol, propylene glycol, glycerol, one or more sugars, or one or more carbohydrates.

Further to the method of embodiment 1, the composition has a molar ratio of the at least one Group IV element to Ag(I) from about 0.0001 to about 0.1.

Further to the method of embodiment 1, the reduction is carried out at one or more temperatures from about 120° C. to about 190° C.

Further to the method of embodiment 1, the method further comprises inerting one or more of the composition, the at least one compound comprising Ag(I), the at least one salt of the at least one Group IV element, the at least one protecting agent, or the at least one solvent.

There is described a silver metal produced according to the method of embodiment 1.

In embodiment 2, there is described at least one article comprising the silver metal produced according to the method of embodiment 1.

Further to the at least one article of embodiment 2, the silver metal comprises at least one silver nanowire.

Further to the at least one article of embodiment 2, the at least one silver nanowire has an average diameter of between about 20 nm and about 150 nm.

Further to the at least one article of embodiment 2, the at least one silver nanowire has an aspect ratio from about 50 to about 10,000.

In embodiment 3, there is described at least one silver nanowire with an average diameter of between 20 nm and about 150 nm, and with an aspect ratio from about 50 to about 10,000.

In embodiment 4, there is described at least one article comprising the at least one silver nanowire of embodiment 3.

In embodiment 5, there is described a method comprising: (a) providing a composition comprising: (i) at least one first compound comprising at least one first reducible metal ion, (ii) at least one second compound comprising at least one second metal or metal ion differing in atomic number from said at least one first reducible metal, said at least one second metal or metal ion comprising at least one non-transition element, and (iii) at least one solvent; and (b) reducing the at least one first reducible metal ion to at least one first metal.

Further to the method of embodiment 5, the composition further comprises at least one protecting agent.

Further to the method of embodiment 5, the at least one protecting agent comprises at least one of: one or more surfactants, one or more acids, or one or more polar polymers.

Further to the method of embodiment 5, the at least one protecting agent comprises polyvinylpyrrolidinone.

Further to the method of embodiment 5, the method further comprises inerting the at least one protecting agent.

Further to the method of embodiment 5, the at least one first reducible metal ion comprises at least one coinage metal ion.

Further to the method of embodiment 5, the at least one first reducible metal ion comprises at least one ion of an element from IUPAC Group 11.

Further to the method of embodiment 5, the at least one first reducible metal ion comprises at least one ion of silver.

Further to the method of embodiment 5, the at least one first compound comprises silver nitrate.

Further to the method of embodiment 5, the at least one second metal or metal ion comprises at least one IUPAC Group 14 element.

Further to the method of embodiment 5, the at least one second metal or metal ion comprises germanium or an ion of germanium.

Further to the method of embodiment 5, wherein the at least one second compound comprises at least one salt of said at least one second metal or metal ion.

Further to the method of embodiment 5, the at least one salt comprises at least one chloride.

Further to the method of embodiment 5, the at least one solvent comprises at least one polyol.

Further to the method of embodiment 5, the at least one solvent comprises at least one of: ethylene glycol, propylene glycol, glycerol, one or more sugars, or one or more carbohydrates.

Further to the method of embodiment 5, the composition has a ratio of the total moles of the at least one second metal or metal to the moles of the at least one first reducible metal ion from about 0.0001 to about 0.1.

Further to the method of embodiment 5, the reduction is carried out at one or more temperatures from about 120° C. to about 190° C.

Further to the method of embodiment 5, the method further comprises inerting one or more of: the composition, the at least one compound comprising at least one first reducible metal ion, the at least one second metal or metal ion, or the at least one solvent.

In embodiment 6, there is described at least one first metal produced according to the method of embodiment 5.

In embodiment 7, there is described at least one article comprising the at least one first metal produced according to the method of embodiment 5.

Further to the at least one article of embodiment 7, the at least one first metal comprises one or more nanowires, nanocubes, nanorods, nanopyramids, or nanotubes.

Further to the at least one article of embodiment 7, the at least one first metal comprises at least one object having an average diameter of between about 10 nm and about 500 nm.

Further to the at least one article of embodiment 7, the at least one first metal comprises at least one object having an aspect ratio from about 50 to about 10,000.

In embodiment 8, there is described at least one metal nanowire with an average diameter of between about 10 nm and about 150 nm, and with an aspect ratio from about 50 to about 10,000.

Further to the nanowire of embodiment 8, the at least one metal comprises at least one coinage metal.

Further to the nanowire of embodiment 8, the at least one metal comprises at least one element of IUPAC Group 11.

Further to the nanowire of embodiment 8, the at least one metal comprises silver.

In embodiment 9, there is described least one article comprising the at least one metal nanowire of embodiment 8.

U.S. application Ser. No. 13/110,977, filed May 19, 2011, entitled NANOWIRE PREPARATION METHODS, COMPOSITIONS, AND ARTICLES, which is hereby incorporated by reference in its entirety, disclosed the following 20 non-limiting exemplary embodiments:

A. A method comprising:
providing at least one first composition comprising at least one first reducible metal ion; and
reducing the at least one first reducible metal ion to at least one first metal in the presence of at least one second metal ion comprising at least one IUPAC Group 14 element in its +2 oxidation state.

B. The method according to embodiment A, wherein the at least one first reducible metal ion comprises at least one coinage metal ion.

C. The method according to embodiment A, wherein the at least one first reducible metal ion comprises at least one ion of an IUPAC Group 11 element.

D. The method according to embodiment A, wherein the at least one first reducible metal ion comprises at least one silver ion.

E. The method according to embodiment A, wherein the at least one composition comprises silver nitrate.

F. The method according to embodiment A, wherein the at least one second metal ion comprises tin in its +2 oxidation state.

G. The method according to embodiment A, wherein the at least one second metal ion comprises germanium in its +2 oxidation state.

H. The method according to embodiment A, wherein the reduction occurs in the presence of at least one halide ion.

J. The method according to embodiment A, wherein the reduction occurs in the presence of at least one protecting agent.

K. The method according to embodiment A, wherein the reduction occurs in the presence of at least one polyol.

L. A product comprising the at least one first metal produced by the method according to embodiment A.

M. The product according to embodiment L, comprising at least one metal nanowire.

N. An article comprising the product according to embodiment L.

P. A composition comprising at least one metal nanowire and at least one ion of an IUPAC Group 14 element.

Q. The composition according to embodiment P, wherein the at least one metal nanowire comprises at least one silver nanowire.

R. The composition according to embodiment P, wherein the at least one metal nanowire comprises a smallest dimension between about 10 nm and about 300 nm.

S. The composition according to embodiment P, wherein the at least one metal nanowire comprises an aspect ratio between about 50 and about 10,000.

T. A product comprising the at least one metal nanowire of the composition according to embodiment P.

U. An article comprising the at least one product according to embodiment T.

V. The article according to embodiment U comprising at least one of an electronic display, a touch screen, a portable telephone, a cellular telephone, a computer display, a laptop computer, a tablet computer, a point-of-purchase kiosk, a music player, a television, an electronic game, an electronic book reader, a transparent electrode, a solar cell, a light emitting diode, an electronic device, a medical imaging device, or a medical imaging medium.

U.S. Provisional Application No. 61/488,930, filed May 23, 2011, entitled NANOWIRE PREPARATION METHODS, COMPOSITIONS, AND ARTICLES, which is hereby incorporated by reference in its entirety, disclosed the following 20 non-limiting exemplary embodiments:

W. A method comprising:
providing at least one first composition comprising at least one first reducible metal ion, and
reducing the at least one first reducible metal ion to at least one first metal in the presence of at least one bromide ion and at least one second metal ion comprising at least one IUPAC Group 14 element.

X. The method according to embodiment W, wherein the at least one first reducible metal ion comprises at least one coinage metal ion.

Y. The method according to embodiment W, wherein the at least one first reducible metal ion comprises at least one ion of an IUPAC Group 11 element.

Z. The method according to embodiment W, wherein the at least one first reducible metal ion comprises at least one silver ion.

AA. The method according to embodiment W, wherein the at least one composition comprises silver nitrate.

AB. The method according to embodiment W, wherein the at least one second metal ion comprises a tin ion.

AC. The method according to embodiment W, wherein the at least one second metal ion comprises tin in its +2 oxidation state.

AD. The method according to embodiment W, wherein the reduction occurs in the presence of at least one protecting agent.

AE. The method according to embodiment W, wherein the reduction occurs in the presence of at least one polyol.

AF. A product comprising the at least one first metal produced by the method according to embodiment W.

AG. The product according to embodiment AF comprising at least one metal nanowire.

AH. An article comprising the product according to embodiment AF.

AJ. A composition comprising at least one metal nanowire, at least one bromide ion, and at least one ion of an IUPAC Group 14 element.

AK. The composition according to embodiment AJ, wherein the at least one metal nanowire comprises at least one silver nanowire.

AL. The composition according to embodiment AJ, wherein the at least one metal nanowire comprises a smallest dimension between about 10 nm and about 100 nm.

AM. The composition according to embodiment AJ, wherein the at least one metal nanowire comprises a smallest dimension between about 30 nm and about 80 nm.

AN. The composition according to embodiment AJ, wherein the at least one metal nanowire comprises an aspect ratio between about 50 and about 10,000.

AP. A product comprising the at least one metal nanowire of the composition of embodiment AJ.

AQ. An article comprising the at least one product according to embodiment AP.

AR. The article according to embodiment AQ comprising at least one of an electronic display, a touch screen, a portable telephone, a cellular telephone, a computer display, a laptop computer, a tablet computer, a point-of-purchase kiosk, a music player, a television, an electronic game, an electronic book reader, a transparent electrode, a solar cell, a light emitting diode, an electronic device, a medical imaging device, or a medical imaging medium.

U.S. Provisional Application No. 61/494,111, filed Jun. 7, 2011, entitled NANOWIRE PREPARATION METHODS, COMPOSITIONS, AND ARTICLES, which is hereby incorporated by reference in its entirety, disclosed the following 22 non-limiting exemplary embodiments:

AS. A method comprising:
providing at least one first composition comprising at least one first reducible metal ion, and
reducing the at least one first reducible metal ion to at least one first metal in the presence of at least one bromide ion, at least one chloride ion, and at least one second metal ion comprising at least one IUPAC Group 14 element.

AT. The method according to embodiment AS, wherein the at least one first reducible metal ion comprises at least one coinage metal ion.

AU. The method according to embodiment AS, wherein the at least one first reducible metal ion comprises at least one ion of an IUPAC Group 11 element.

AV. The method according to embodiment AS, wherein the at least one first reducible metal ion comprises at least one silver ion.

AW. The method according to embodiment AS, wherein the at least one composition comprises silver nitrate.

AX. The method according to embodiment AS, wherein the at least one second metal ion comprises a tin ion.

AY. The method according to embodiment AS, wherein the at least one second metal ion comprises tin in its +2 oxidation state.

AZ. The method according to embodiment AS, wherein the reduction occurs in the presence of at least one protecting agent.

BA. The method according to embodiment AS, wherein the reduction occurs in the presence of at least one polyol.

BB. A product comprising the at least one first metal produced by the method according to embodiment AS.

BC. The product according to embodiment BB comprising at least one metal nanowire.

BD. An article comprising the product according to embodiment BC.

BE. The method according to embodiment AS, further comprising providing a first compound comprising at least one chlorine atom and at least one second compound comprising at least one bromine atom, wherein the molar ratio of the at least one chlorine atom to the at least one bromine atom is at least about 4.4 and less than about 76.8.

BF. The method according to embodiment BE, wherein the molar ratio of the at least one chlorine atom to the at least one bromine atom is at least about 4.8 and less than about 6.2.

BG. A composition comprising at least one metal nanowire, at least one bromide ion, at least one chloride ion, and at least one ion of an IUPAC Group 14 element.

BH. The composition according to embodiment BG, wherein the at least one metal nanowire comprises at least one silver nanowire.

BJ. The composition according to embodiment BG, wherein the at least one metal nanowire comprises a smallest dimension between about 10 nm and about 100 nm.

BK. The composition according to embodiment BG, wherein the at least one metal nanowire comprises a smallest dimension between about 15 nm and about 80 nm.

BL. The composition according to embodiment BG, wherein the at least one metal nanowire comprises an aspect ratio between about 50 and about 10,000.

BM. A product comprising the at least one metal nanowire of the composition of embodiment BG.

BN. An article comprising the at least one product according to embodiment BM.

BP. The article according to embodiment BN comprising at least one of an electronic display, a touch screen, a portable telephone, a cellular telephone, a computer display, a laptop computer, a tablet computer, a point-of-purchase kiosk, a music player, a television, an electronic game, an electronic book reader, a transparent electrode, a solar cell, a light emitting diode, an electronic device, a medical imaging device, or a medical imaging medium.

EXAMPLES

Example 1 (Comparative)

To a 500 mL reaction flask containing 200 mL ethylene glycol (EG), 1.92 mL of a 4 mM $CuCl_2$ solution in EG was added and degassed by bubbling nitrogen into the solution using a glass pipette. Stock solutions of 0.094 M $AgNO_3$ in EG and 0.282 M polyvinylpyrrolidinone (PVP) in EG were also degassed by bubbling nitrogen into the solutions. Two syringes were then loaded with 20 mL each of the $AgNO_3$ and PVP solutions. The reaction mixture was heated to 145° C. under nitrogen and, after the reaction mixture was held 60 minutes at the set point temperature, the $AgNO_3$ and PVP solutions were then added at a constant rate over 25 minutes via a 20 gauge TEFLON® fluoropolymer syringe needle. The reaction mixture was held at 145° C. for 90 minutes and then allowed to cool to ambient temperature.

From the cooled mixture, a 15 mL aliquot was diluted with 35 mL isopropanol (IPA), centrifuged for 15 minutes at 1500 rpm, decanted, and re-dispersed in 5 mL IPA. This sample was used for analysis by scanning electron microscopy (SEM). FIG. 1 is a scanning electron micrograph of the nanowire product, which had an average diameter of 254 nm.

Example 2 (Comparative)

To a 500 mL reaction flask containing 280 mL EG, 1.6 g of a freshly prepared 11.5 mM $SnCl_4.5H_2O$ solution in EG was added and degassed for 2 hrs by bubbling nitrogen into the solution using a glass pipette with mechanical stirring at 100 rpm. Stock solutions of 0.25 M $AgNO_3$ in EG and 0.77 M PVP in EG were also degassed by bubbling $N_2$ into the solutions for 60 min. Two syringes were loaded with 20 mL each of the $AgNO_3$ and PVP solutions. The reaction mixture was heated to 145° C. under nitrogen and, after the reaction mixture was held 10 minutes at the set point temperature, $AgNO_3$ and PVP solutions were added at a constant rate over 25 minutes via a 12 gauge TEFLON® fluoropolymer syringe needle. The reaction mixture was held at 145° C. for 90 minutes, at which time a sample was taken for analysis by optical microscopy, and then allowed to cool to ambient temperature.

Figure 2:
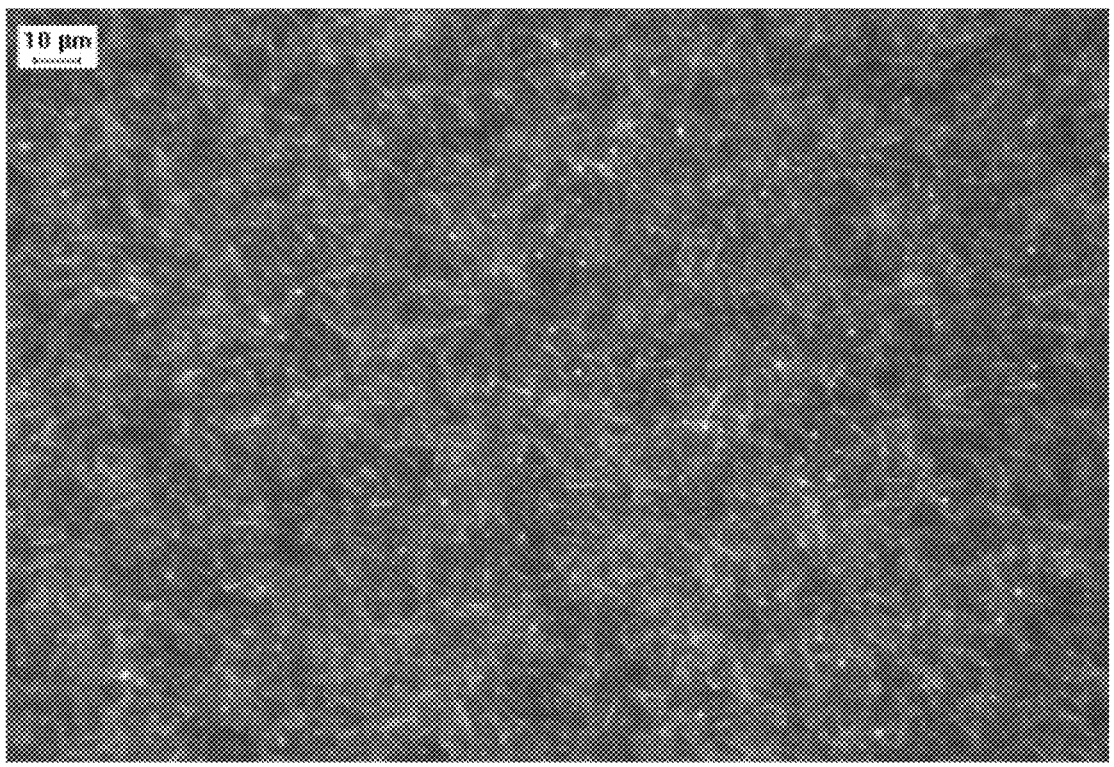
FIG. 2 shows an optical micrograph of the product of Comparative Example 2.

FIG. 2 is an optical micrograph of this product sample. Compared to Sn2+ under similar conditions, Sn4+ does not appear to function well in controlling silver morphology, based on its low yield of only short silver nanowires and its high yield of silver nanoparticles.

Example 3 (Comparative)

To a 500 mL reaction flask containing 280 mL EG, 70 µL of a freshly prepared 0.14 M anhydrous $SnCl_4$ solution in EG was added and degassed for 2 hrs by bubbling nitrogen into the solution using a glass pipette with mechanical stirring at 100 rpm. Stock solutions of 0.25 M AgNO$_3$ in EG and 0.77 M PVP in EG were also degassed by bubbling N$_2$ into the solutions for 60 min. Two syringes were loaded with 20 mL each of the AgNO$_3$ and PVP solutions. The reaction mixture was heated to 145° C. under nitrogen and, after the reaction mixture was held 10 minutes at the set point temperature, AgNO$_3$ and PVP solutions were added at a constant rate over 25 minutes via a 12 gauge TEFLON® fluoropolymer syringe needle. The reaction mixture was held at 145° C. for 90 minutes, at which time a sample was taken for analysis by optical microscopy, and then allowed to cool to ambient temperature.

Figure 3:
FIG. 3 shows an optical micrograph of the product of Comparative Example 3.

FIG. 3 is an optical micrograph of this product sample. Compared to Sn$^{2+}$ under similar conditions, Sn$^{4+}$ does not appear to function well in controlling silver morphology, based on its low yield of only short silver nanowires and its high yield of silver nanoparticles.

Example 4

Figure 4:
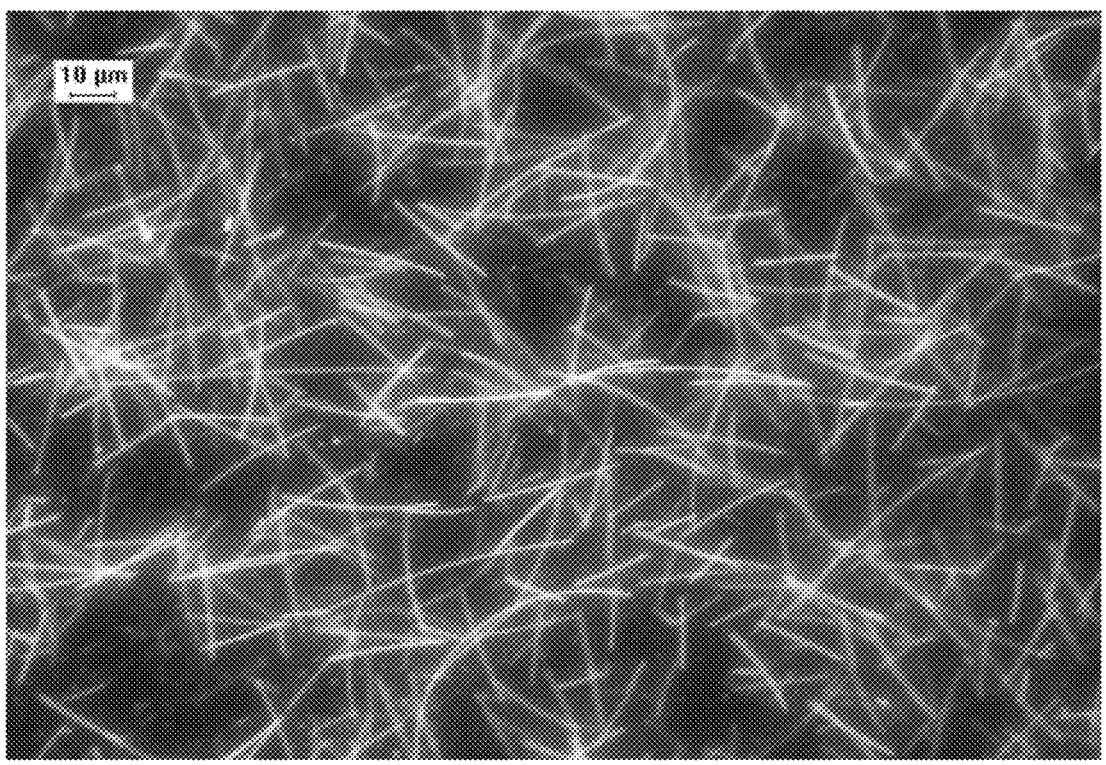
FIG. 4 shows an optical micrograph of the product of Example 4 synthesized in the presence of $SnCl_2$.

To a 500 mL reaction flask containing 280 mL EG, 1.0 mL of 9.3 mM SnCl$_2$ in EG was added and degassed for 2 hrs by bubbling nitrogen into the solution using a glass pipette with mechanical stirring at 100 rpm. Stock solutions of 0.25 M AgNO$_3$ in EG and 0.77 M PVP in EG were also degassed by bubbling N$_2$ into the solutions for 60 min. Two syringes were loaded with 20 mL each of the AgNO$_3$ and PVP solutions. The reaction mixture was heated to 145° C. under nitrogen and, after the reaction mixture was held 10 minutes at the set point temperature, AgNO$_3$ and PVP solutions were added at a constant rate over 25 minutes via a 12 gauge TEFLON® fluoropolymer syringe needle. The reaction mixture was held at 145° C. for 90 minutes, at which time a sample was taken for analysis by optical microscopy, and then allowed to cool to ambient temperature. FIG. 4 is an optical micrograph of this product sample.

Figure 5:
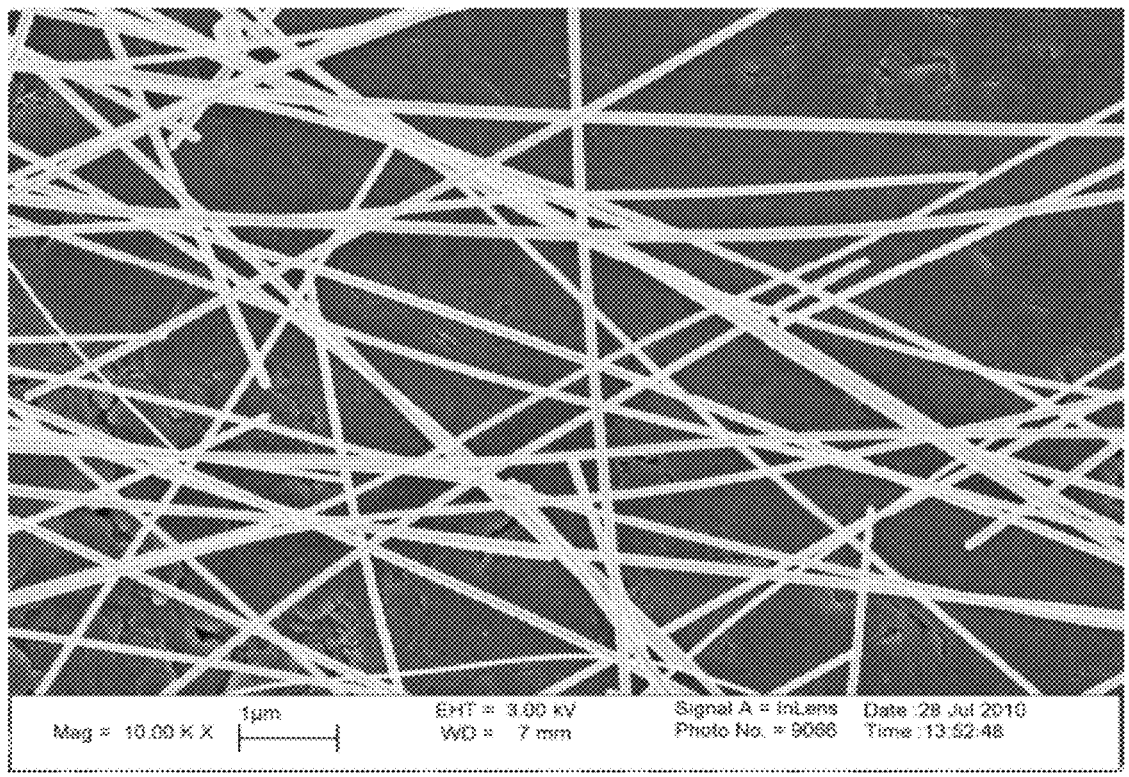
FIG. 5 shows a scanning electron micrograph of the purified product of Example 4.

From the cooled mixture, a 15 mL aliquot was diluted with 35 mL IPA, centrifuged for 15 minutes at 1500 rpm, decanted, and re-dispersed in 5 mL IPA. This purified sample was used for analysis by SEM. FIG. 5 is a scanning electron micrograph of this purified product sample. The average nanowire diameter was 97±24 nm.

Example 5

To a 500 mL reaction flask containing 280 mL EG. 2.0 g of 13.4 mM GeCl$_2$ was added and degassed for 2 hrs by bubbling N$_2$ into the solution using a glass pipette at room temperature with mechanical stirring at 100 rpm. Stock solutions of 0.25 M AgNO$_3$ in EG and 0.77 M PVP in EG were also degassed by bubbling N$_2$ into the solutions for 60 min. Two syringes were loaded with 20 mL each of the AgNO$_3$ and PVP solutions. The reaction mixture was heated to 145° C. under N$_2$ and then, after the reaction mixture was held for 10 min, the AgNO$_3$ and PVP solutions were added at a constant rate over 25 minutes via 12 gauge TEFLON® fluoropolymer syringe needles. The reaction mixture was held at 145° C. for 90 minutes, at which time a sample was taken for analysis by optical microscopy, and then allowed to cool to room temperature.

Figure 6:
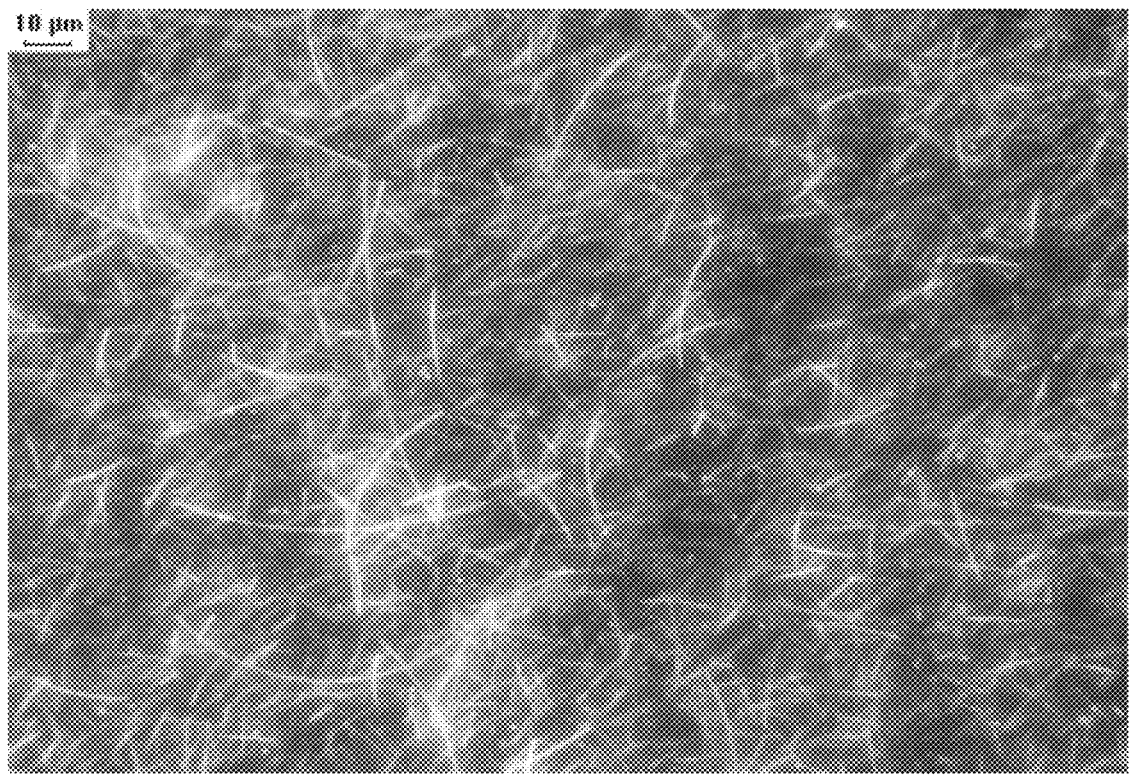
FIG. 6 shows an optical micrograph of the product of Example 5.
Figure 7:
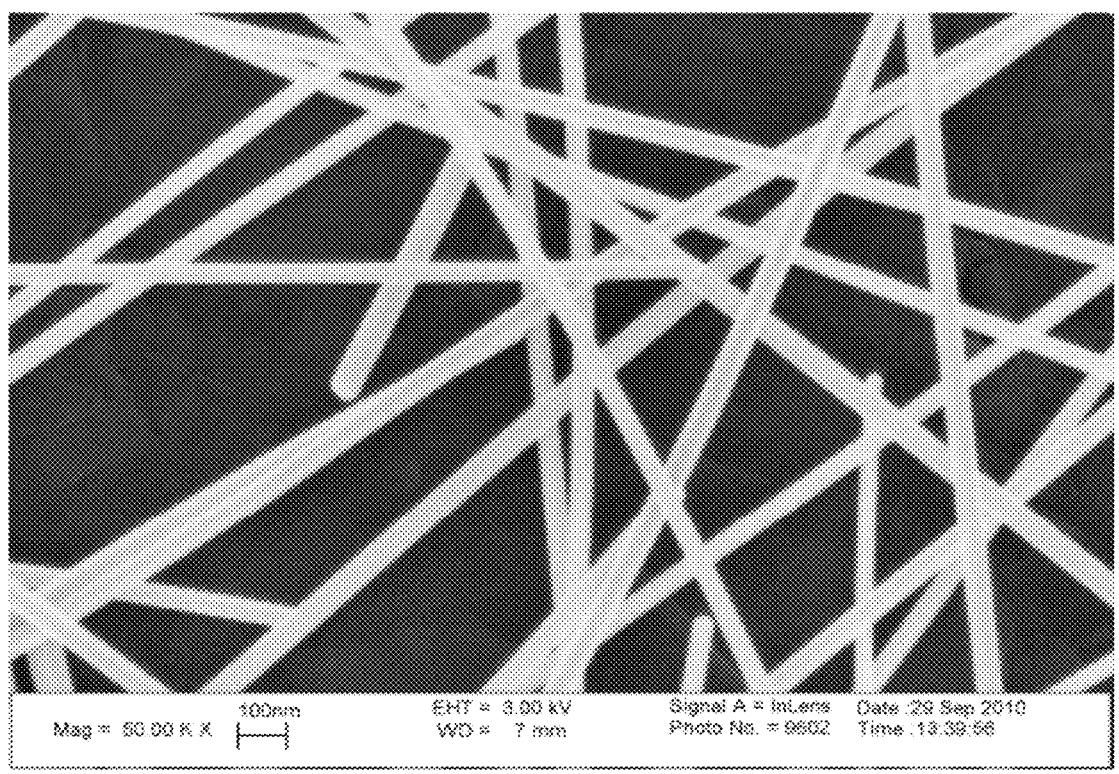
FIG. 7 shows a scanning electron micrograph of the purified product of Example 5.

From the cooled mixture, a 15 mL aliquot was diluted with 35 mL IPA, centrifuged for 15 minutes at 1500 rpm, decanted, and re-dispersed in 5 mL IPA. This purified sample was used for analysis by SEM. Optical and scanning electron micrographs, FIGS. 6 and 7, respectively, show the silver nanowires prepared using Ge$^{2+}$, with minimal nanoparticle contamination. The average nanowire diameter was 31±16 nm and the average length was 8.7±2.7 μm.

Example 6 (Comparative)

A suspension of colloidal silver(0) in EG was prepared according to the procedure of Silvert, P.-V.; Herrera-Urbina, R.; Duvauchelle, N.; Vijayakrishnan, V.; Elhsissen, K. T.; *J. Mater. Chem.* 1996, 6 (4), 573-577, which is hereby incorporated by reference in its entirety. Accordingly, to a solution of 1.5 g of 10,000 molecular weight PVP in 75 mL of EG was added 50.1 mg of silver nitrate. After stirring 12 minutes at 22° C., the solution was heated to 120° C. over 136 min, then held at 120° C. for 23 min to give the colloidal silver suspension.

A solution of 14.47 g of silver nitrate in 905 mL of EG and a solution of 83.76 g of 55,000 molecular weight PVP in 905 mL of EG were prepared and nitrogen bubbled into each for 3 hr. Into a 5 L round-bottomed flask equipped with a 4-bladed turbine stirrer was charged 3003 mL of EG and 19.2 mL of 0.006 M iron (II) chloride tetrahydrate in EG. Nitrogen was then bubbled through this mixture for 17 hr, which was then kept under a nitrogen blanket and heated to 146° C. 4.35 mL of the colloidal silver suspension was then added, followed by the silver nitrate and PVP solutions over 31 min. The resulting mixture was then held at 145-147° C. for 64 min, and then allowed to cool to room temperature.

The mixture was filtered through a screen to remove agglomerates and 826.5 g of the suspension was processed by adding an equal volume of acetone and centrifuging at 300 G for 45 min. The supernatant was decanted and discarded, while IPA was added to the residue and shaken for 30 min. This centrifugation/decanting/resuspension process was then repeated two times, after which evaporated drops of the nanowire suspension were examined by optical microscopy (for length) and by SEM (for diameter). More than 100 wires were measured by each method and the average length and standard deviation determined to be 13±16 μm and the average diameter and standard deviation to be 118±53 nm.

Example 7

Stock solutions of 144.7 g of silver nitrate in 3000 mL of EG and 284.0 g of 55000 molecular weight PVP in 3000 mL of EG were prepared. The solutions were stored, maintaining a stream of bubbling nitrogen bubbling through each.

Into a 2 L cylindrical flask equipped with a 4-bladed turbine stirrer was charged 1684 mL of EG and 21.0 mg of tin (II) chloride dihydrate. Nitrogen was bubbled into through this mixture overnight. The mixture was then heated to 101° C., after which the nitrogen bubbling was stopped. The mixture was then further heated to and held at 144 to 146° C. Using a syringe pump, 120 mL of each stock solution of silver nitrate and PVP was added over 26 min, after which the mixture was held at temperature for an additional 60 min. The contents of the flask was drained into an ice-cooled beaker, filtered through a screen to remove agglomerates, and 811.26 g of the slurry processed by adding an equal volume of acetone and centrifuging at 400 G for 45 min. The supernatant was decanted and discarded, with the residue being resuspended in IPA by shaking for 11 min, followed again by centrifuging at 400 G for 45 min. After another cycle of shaking with IPA, centrifuging, and decanting the supernatant, IPA was added to the residue and a final silver nanowire suspension in IPA obtained. Evaporated drops of the nanowire suspension were examined by optical microscopy (for length) and SEM (for diameter). More than 100 wires were measured by each method and the average length and standard deviation determined to be 23±9 μm and the average diameter and standard deviation to be 80±18 nm.

Example 8

Stock solutions of 144.7 g of silver nitrate in 3000 mL of EG and 284.0 g of 55000 molecular weight PVP in 3000 mL of EG were prepared. The solutions were stored, maintaining a stream of bubbling nitrogen bubbling through each.

Into a 10 L cylindrical flask equipped with a 4-bladed turbine stirrer was charged 7000 mL of ethylene glycol and 87.9 mg of tin (II) chloride dihydrate. Nitrogen was bubbled through this mixture overnight. The mixture was heated to 101° C., after which the nitrogen bubbling was stopped. The mixture was then further heated to and held at 144 to 146° C. Using a pump, 500 mL of each stock solution was added over 25 to 26 min, then the mixture held at temperature for an additional 1 hr. The contents of the flask was drained into an ice-cooled flask, filtered through a screen to remove agglomerates, and 775.62 g of the slurry was processed by adding an equal volume of acetone and centrifuging at 400 G for 45 min. The supernatant was decanted and discarded, the residue suspended in IPA by shaking for 24 min. The suspension was then centrifuged again at 400 G for 45 min. After another cycle of shaking with IPA, centrifuging, and decantation of the supernatant, IPA was then added to the residue and a final silver nanowire suspension in IPA obtained. Evaporated drops of the nanowire suspension were examined by optical microscopy (for length) and by SEM (for diameter). More than 100 wires were measured by each method and the average length and standard deviation were determined to be 24±9 μm and the average diameter and standard deviation to be 82±16 nm. There was only a low level of non-nanowire particles present.

Example 9

The procedure of Example 8 was repeated with the following changes. 87.8 mg of tin (II) chloride dihydrate and 750 mL of each of the stock solutions were used, the PVP stock solution was added over 43 min, and the silver nitrate stock solution was added over 36 min. The product nanowire average length and standard deviation were determined to be 25±12 μm and the average diameter and standard deviation to be 92±25 nm. There was only a low level of non-nanowire particles present.

Example 10

The procedure of Example 8 was repeated with the following changes. 175.8 mg of tin (II) chloride dihydrate was used, the silver nitrate stock solution consisted of 106.11 g of silver nitrate in 1100 mL of EG, the PVP stock solution consisted of 208.27 g of PVP in 1100 mL of EG, the stock solutions were added over 25 min, and the post-addition hold time was 33 min. The average length and standard deviation were determined to be 23±11 μm and the average diameter and standard deviation to be 80±22 nm. There was only a low level of non-nanowire particles present.

Example 11

Figure 8:
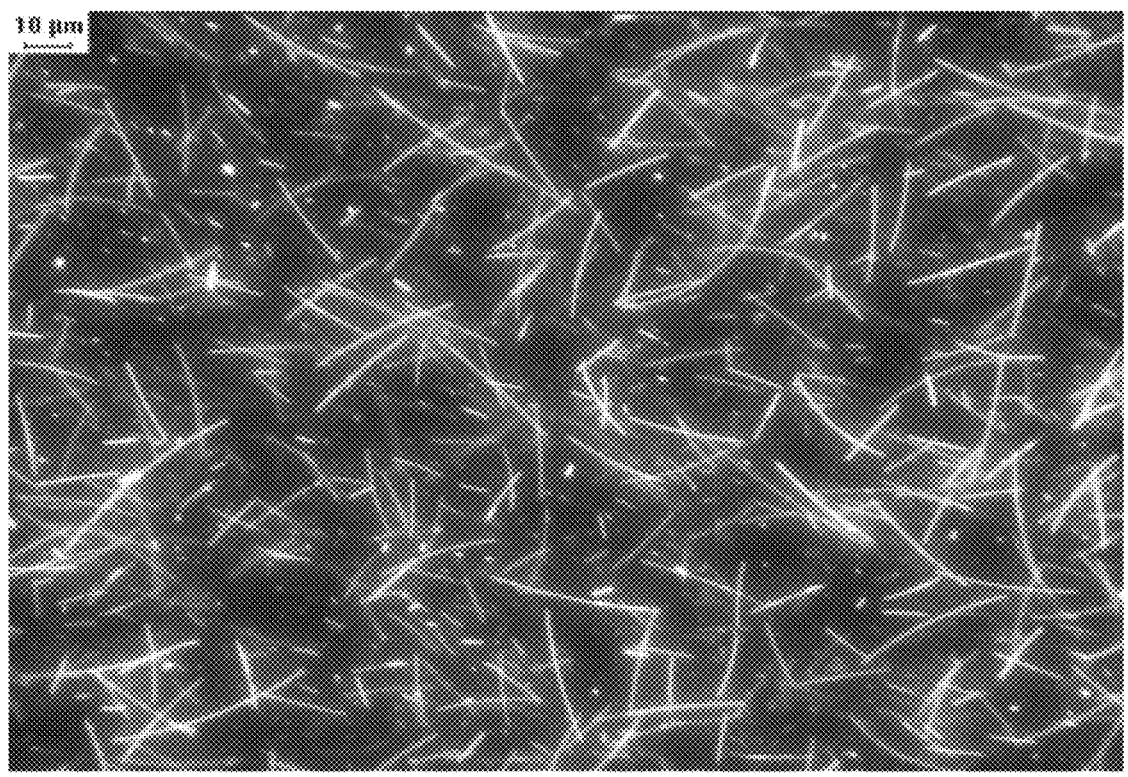
FIG. 8 shows an optical micrograph of the product of Example 11.

To a 500 mL reaction flask containing 280 mL EG, 1.1 g of 21 mM $SnSO_4$ in EG and 2.8 g of 13 mM NaCl in EG were added and degassed for 2 hrs by bubbling nitrogen into the solution using a TEFLON® fluoropolymer tube with mechanical stirring at 100 rpm. Stock solutions of 0.25 M $AgNO_3$ in EG and 0.84 M PVP in EG were also degassed by bubbling nitrogen into the solutions. Two syringes were loaded with 20 mL each of the $AgNO_3$ and PVP solutions. The nitrogen tube was retracted from the reaction mixture to blanket the headspace of the flask at approximately 0.5 L/min nitrogen. The reaction mixture was heated to 145° C. under nitrogen and then the $AgNO_3$ and PVP solutions were added at a constant rate over 25 minutes via a 12 gauge TEFLON® fluoropolymer syringe needle. The reaction mixture was held at 145° C. for 60 minutes, at which time a sample was taken for analysis by optical microscopy, and then allowed to cool to ambient temperature. FIG. 8 is an optical micrograph of this product sample. The average nanowire diameter was 81.7±27.9 nm and the average length was 17.2±10.0 μm.

Example 12

To a 500 mL reaction flask containing 280 mL EG, sufficient $SnCl_2.2H_2O$ in EG was added so as to provide a 26, 48, or 90 μM $SnCl_2$ solution as measured in the final reaction mixture. This mixture which was then degassed by sparging nitrogen into the solution overnight. Stock solutions of 0.282 M $AgNO_3$ in EG and 0.848 M PVP in EG were also degassed by sparging with nitrogen. Two syringes were loaded with 20 mL each of the $AgNO_3$ and PVP solutions. The reaction mixture was heated to 145° C. over 60 min. After 30 min of heating, nitrogen sparging was discontinued, and the reaction flask headspace was blanketed with nitrogen. After the reaction mixture temperature stabilized at the set point, mechanical agitation was started, and the $AgNO_3$ and PVP solutions were added at a constant rate over 25 minutes. This final reaction mixture was held at 145° C. for 60 minutes. After quenching in an ice bath, the product solution was filtered through a Buchner funnel to determine the level of agglomeration. The filtrate was then worked up by dilution with acetone, centrifugation at 400 G, and resuspension in 2-propanol.

Figure 9:
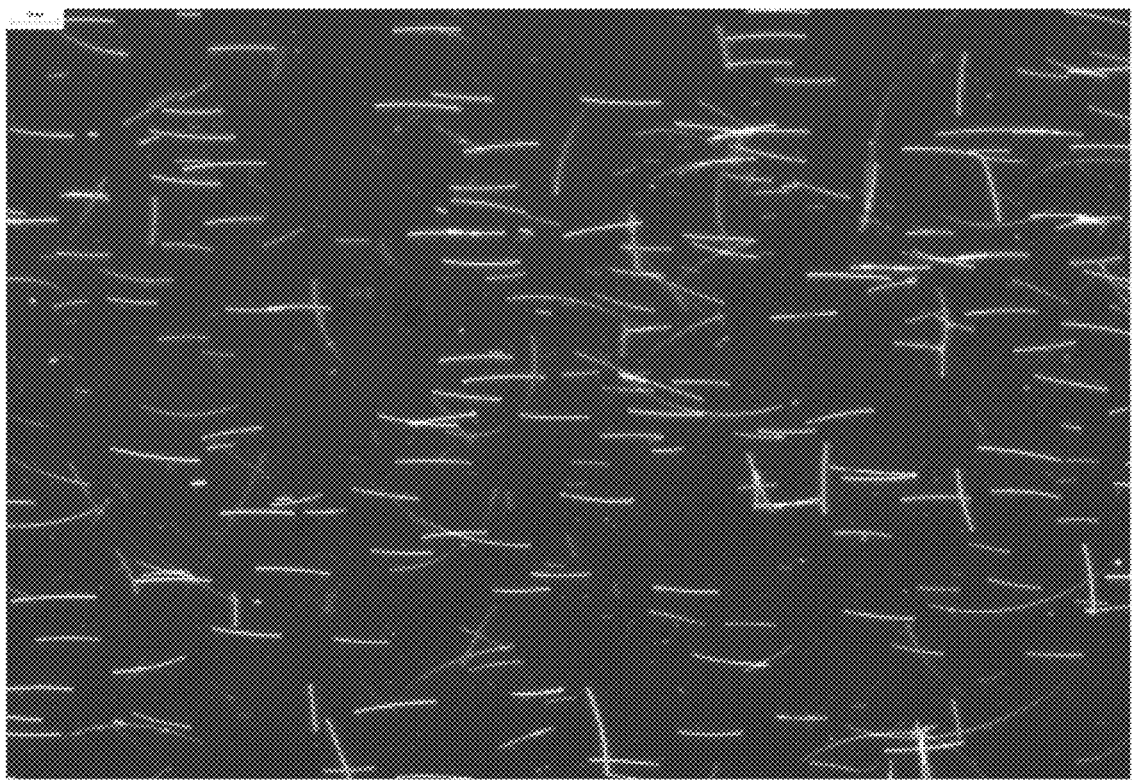
FIG. 9 shows an optical micrograph of the product of Example 12 synthesized in the presence of 26 µM $SnCl_2$.

FIG. 9 is an optical micrograph of the product produced in the presence of the 26 μM $SnCl_2$ solution. No agglomerates were detected during filtration. The micrograph shows a high level of non-wire particles. The nanowires had an average diameter of 69±19 nm and an average length of 18.7±7.1 μm.

Figure 10:
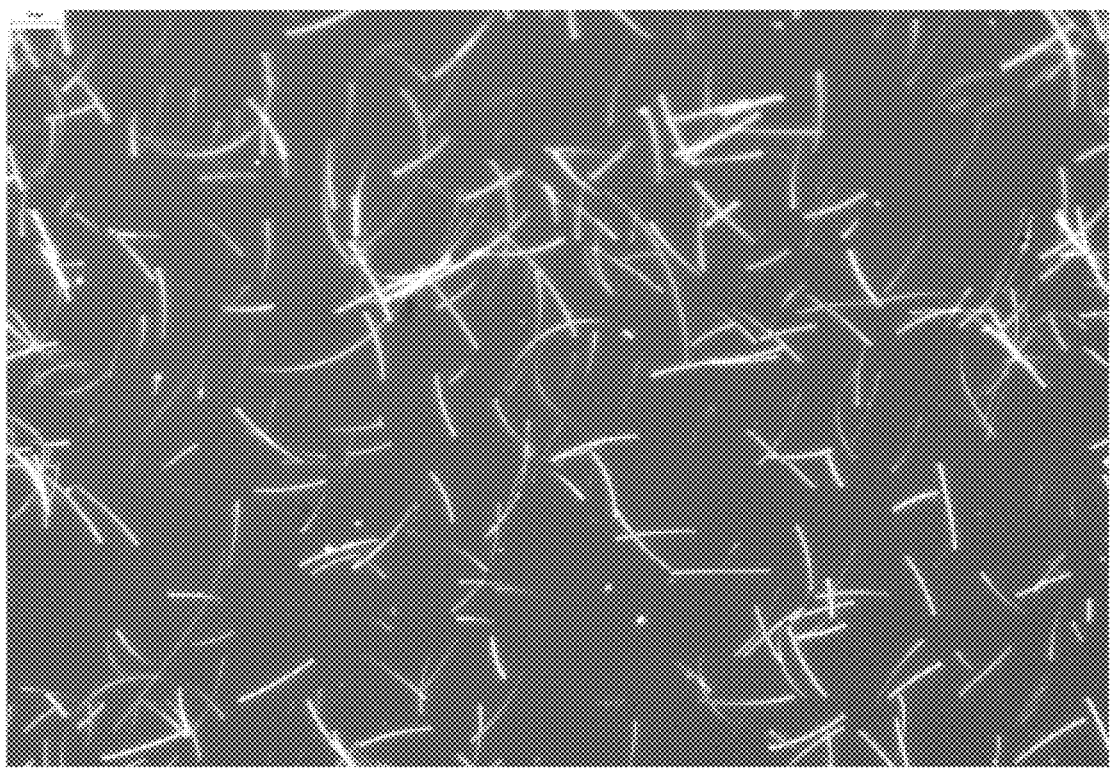
FIG. 10 shows an optical micrograph of the product of Example 12 synthesized in the presence of 48 µM $SnCl_2$.

FIG. 10 is an optical micrograph of the product produced in the presence of the 48 μM $SnCl_2$ solution. No agglomerates were detected during filtration. The micrograph shows a low level of non-wire particles. The nanowires had an average diameter of 63±15 nm and an average length of 19.7±7.3 μm.

Figure 11:
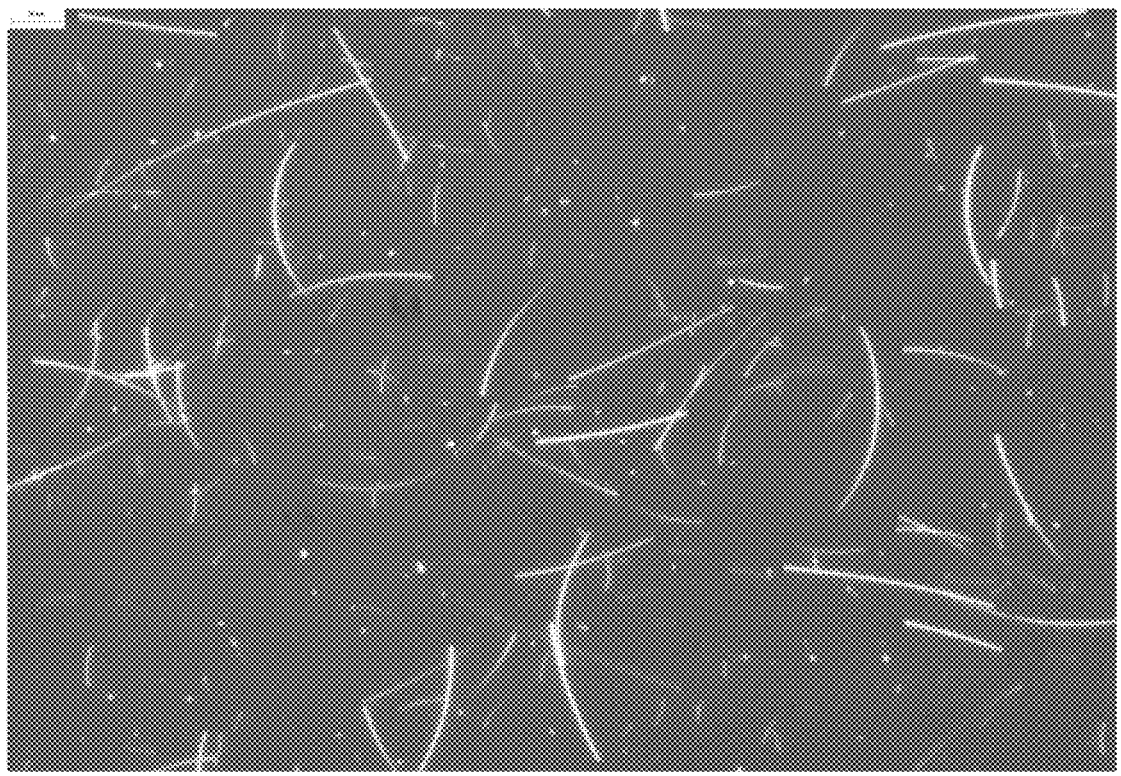
FIG. 11 shows an optical micrograph of the product of Example 12 synthesized in the presence of 90 $SnCl_2$.

FIG. 11 is an optical micrograph of the product produced in the presence of the 90 μM $SnCl_2$ solution. No agglomerates were detected during filtration. The micrograph shows a high level of non-wire particles. The nanowires had an average diameter of 73±23 nm and an average length of 29.9±11.6 μm.

Example 13 (Comparative)

The procedure of Example 12 was replicated, with the following changes: in place of the tin (II) chloride dihydrate solutions, 3 mL of 0.011 M sodium chloride in EG was used; the reaction time was extended by 30 minutes; and the centrifugation was performed at 600 G.

Figure 12:
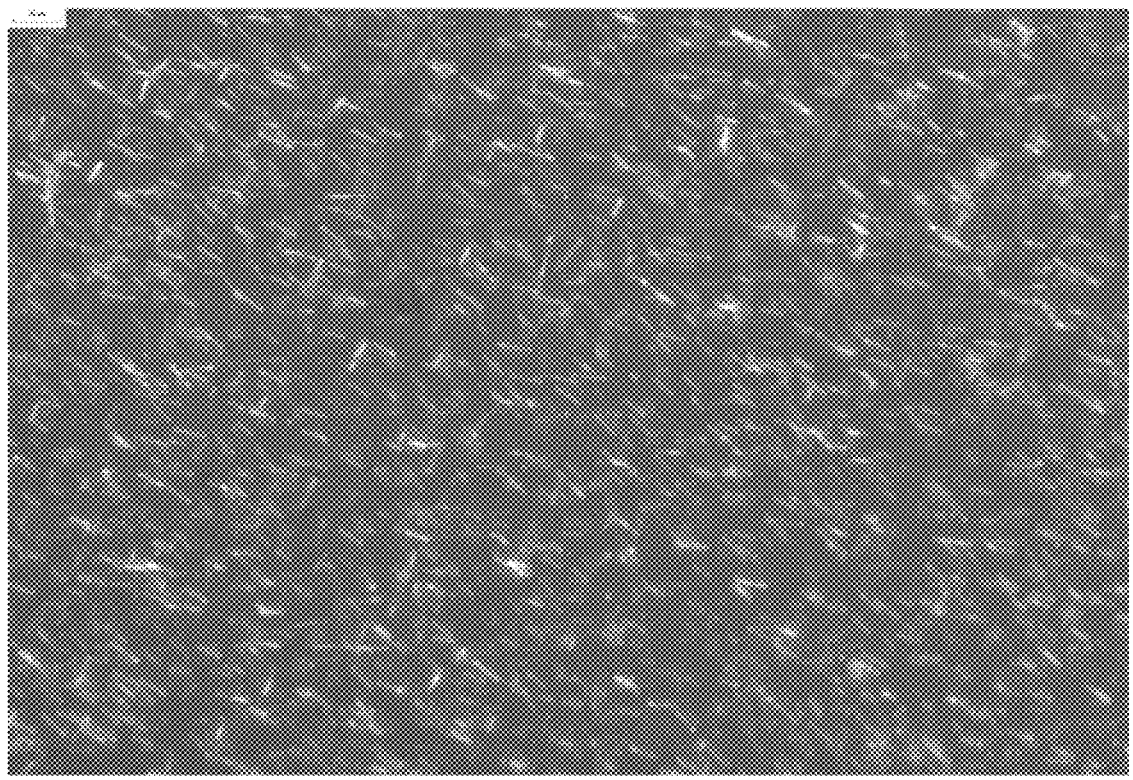
FIG. 12 shows an optical micrograph of the product of Comparative Example 13.

FIG. 12 is an optical micrograph of the product. The nanowires had an average diameter of 52±11 nm and an average length of 8.4±2.7 μm.

Example 14

To a 500 mL reaction flask containing 300 mL ethylene glycol (EG), 10 g polyvinylpyrrolidinone (PVP) and 10 mg tin (II) bromide were added at room temperature. The flask was then heated to 145° C. while degassing by bubbling nitrogen through its contents. After 60 min, nitrogen bubbling was discontinued and the reaction flask headspace was instead blanketed with nitrogen. A solution of 3.3 g $AgNO_3$ in 60 mL EG, which had been degassed by bubbling nitrogen through it, was then added to the reaction flask at a constant rate 1.6 mL/min for 43 min via a syringe needle. After addition of the $AgNO_3$ solution, the flask was held at temperature for 66 min, after which the reaction was quenched by immersing the flask in ice.

The reaction product was washed with acetone and isopropanol, then centrifuged to obtain the product silver nanowires. The average nanowire diameter was determined by scanning electron microscopy to be 72±33 nm.

Example 15

The procedure of Example 14 was repeated, using a reaction temperature of 160° C. and adding the $AgNO_3$ solution at 1.6 mL/min for only 22 min. The average nanowire diameter was determined by scanning electron microscopy of be 49±17 nm.

Figure 13:
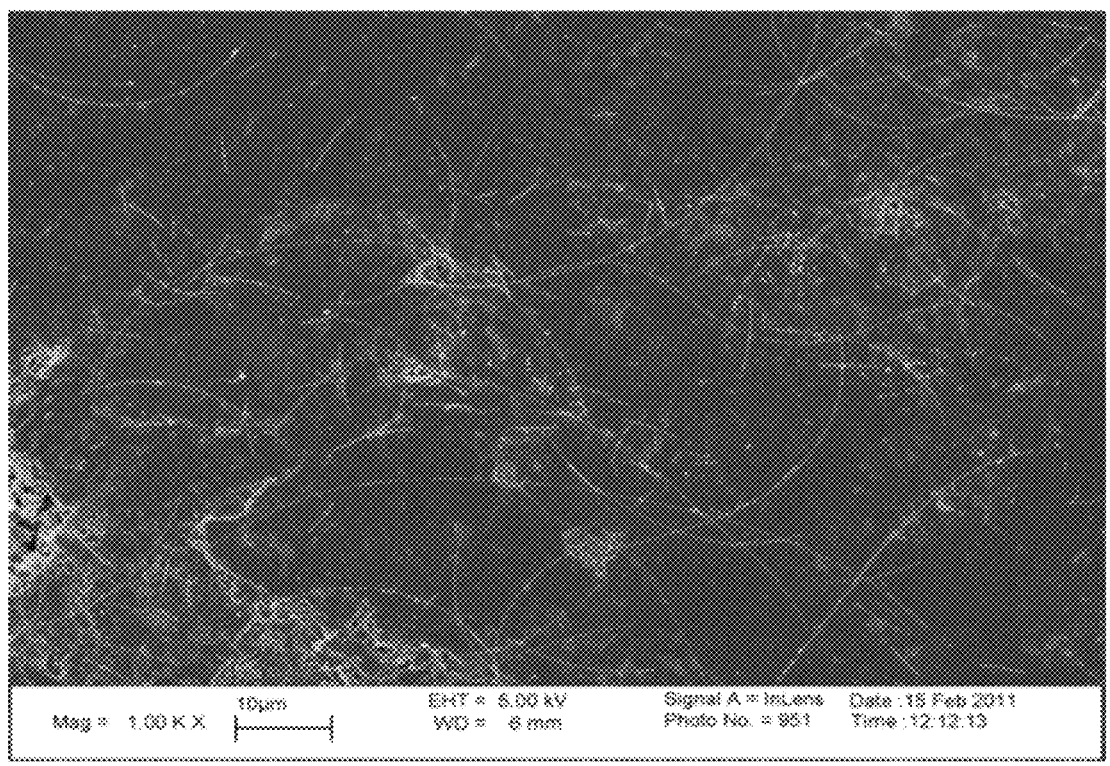
FIG. 13 shows a 1000-power micrograph of the product of Example 15.
Figure 14:
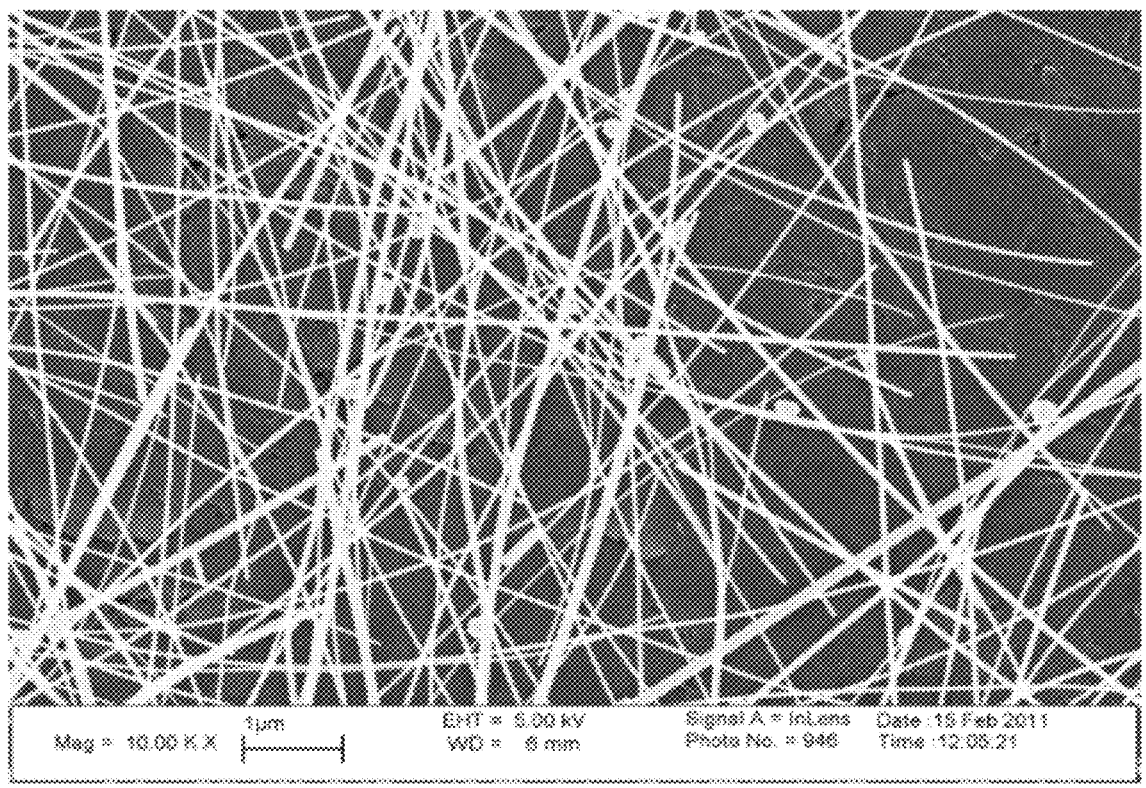
FIG. 14 shows a 10,000-power micrograph of the product of Example 15.

FIG. 13 shows a 1000-power micrograph of the product. FIG. 14 shows a 10,000-power micrograph of the product.

Example 16

The procedure of Example 15 was repeated, using a reaction temperature of 170° C. The average nanowire diameter was determined by scanning electron microscopy of be 37±18 nm.

Example 17

To a 500 mL reaction flask containing 300 mL EG, 12.0 g PVP, 62.5 mg potassium bromide, and 9.8 mg tin (II) chloride were added at room temperature. The flask was then heated to 170° C. while degassing by bubbling nitrogen through its contents. After 40 min, nitrogen bubbling was discontinued and the reaction flask headspace was instead blanketed with nitrogen. 260.1 mg silver chloride was then added to the reaction flask. A solution of 3.3 g $AgNO_3$ in 60 mL EG, which had been degassed by bubbling nitrogen through it, was then added to the reaction flask at a constant rate 1.6 mL/min for 45 min via a syringe needle. After addition of the $AgNO_3$ solution, the flask was held at temperature for 180 min, after which the reaction was quenched by immersing the flask in ice.

The reaction product was washed with acetone and isopropanol, then centrifuged to obtain the product silver nanowires. The average nanowire diameter was determined by scanning electron microscopy to be 43±24 nm.

Figure 15:
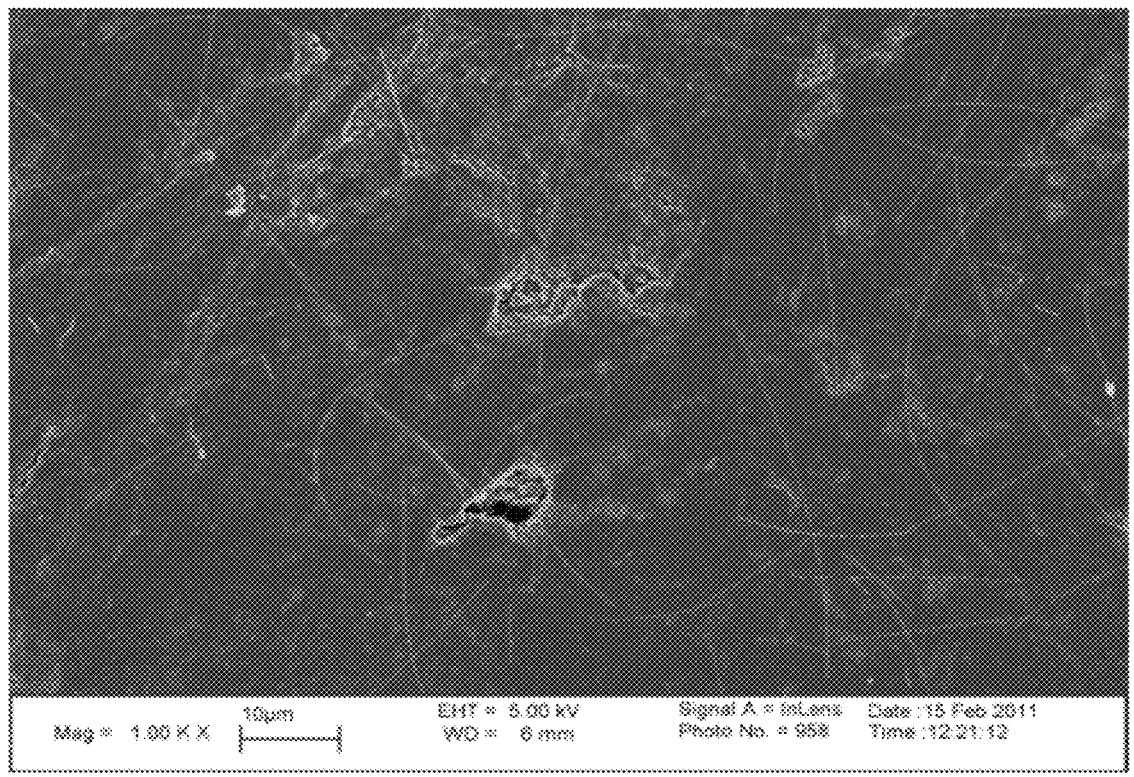
FIG. 15 shows a 1000-power micrograph of the product of Example 17.
Figure 16:
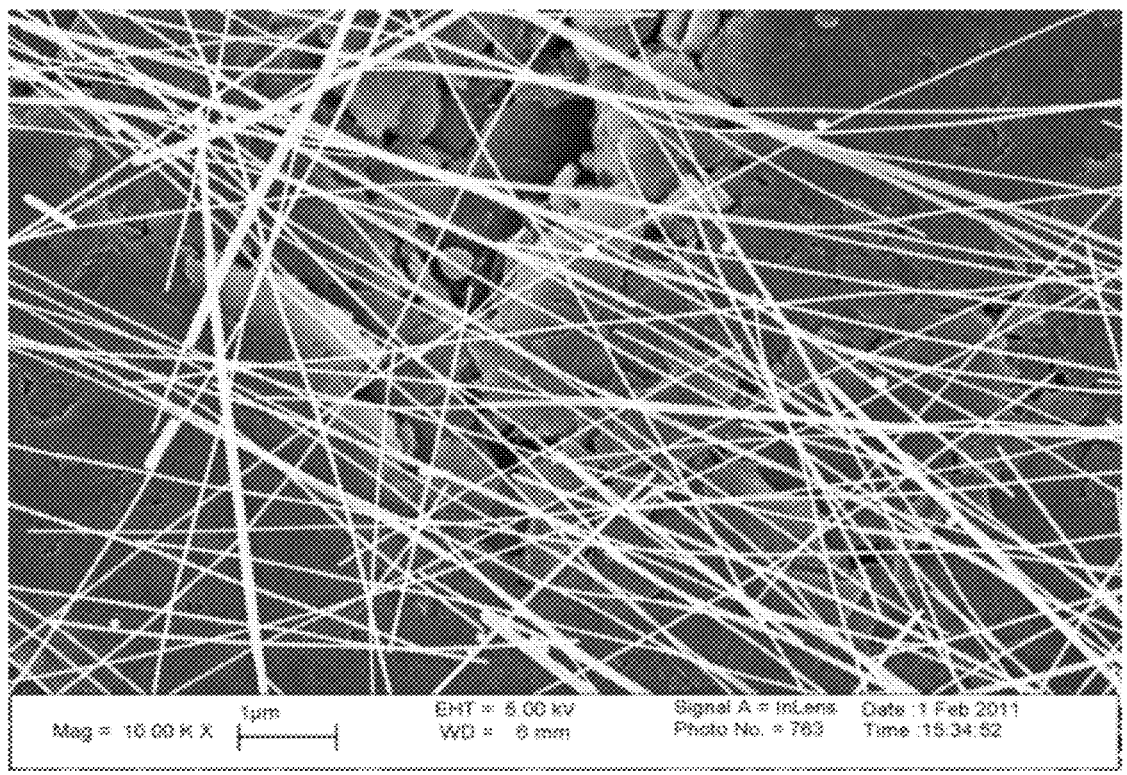
FIG. 16 shows a 10,000-power micrograph of the product of Example 17.

FIG. 15 shows a 1000-power micrograph of the product. FIG. 16 shows a 10,000-power micrograph of the product.

Example 18

To a 500 mL reaction flask containing 300 mL EG, 10.0 g PVP, 160.1 mg sodium chloride, and 10.0 mg tin (II) bromide were added at room temperature. The flask was then heated to 160° C. while degassing by bubbling nitrogen through its contents. After 60 min, nitrogen bubbling was discontinued and the reaction flask headspace was instead blanketed with nitrogen. A solution of 3.3 g $AgNO_3$ in 60 mL EG, which had been degassed by bubbling nitrogen through it, was then added to the reaction flask at a constant rate of 1.2 mL/min for 42 min via a syringe needle. After addition of the $AgNO_3$ solution, the flask was held at temperature for 66 min, after which the reaction was quenched by immersing the flask in ice.

The reaction product was washed with acetone and isopropanol, then centrifuged to obtain the product silver nanowires. The average nanowire diameter was determined by scanning electron microscopy to be 65±24 nm.

Example 19

The procedure of Example 18 was repeated, using 70.2 mg sodium chloride, 10.1 mg tin (II) bromide, and a hold time after addition of the silver nitrate of 11 min. The average nanowire diameter was determined by scanning electron microscopy of be 80±15 nm.

Example 20

The procedure of Example 18 was repeated, using 13.1 mg sodium chloride, 10.2 mg tin (II) bromide, and a hold time after addition of the silver nitrate of 12 min. The average nanowire diameter was determined by scanning electron microscopy of be 57±11 nm.

Figure 17:
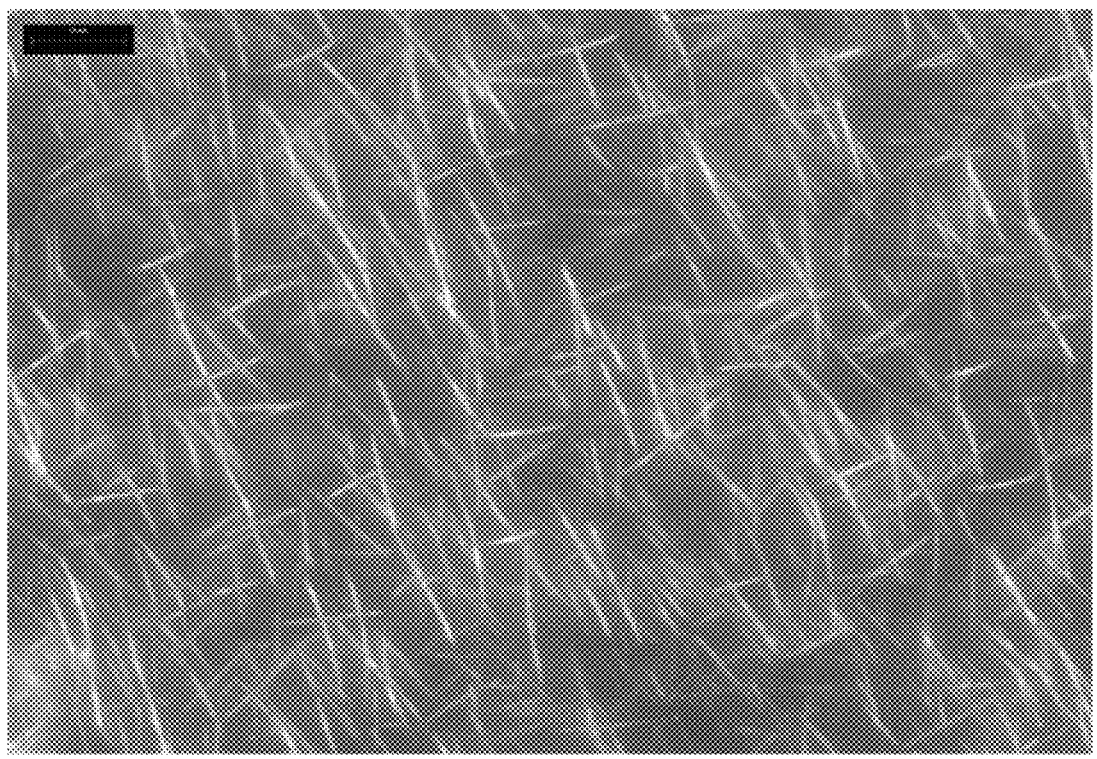
FIG. 17 shows an optical micrograph of a sample of the reaction mixture of Example 20, just after the end of adding the silver nitrate solution.
Figure 18:
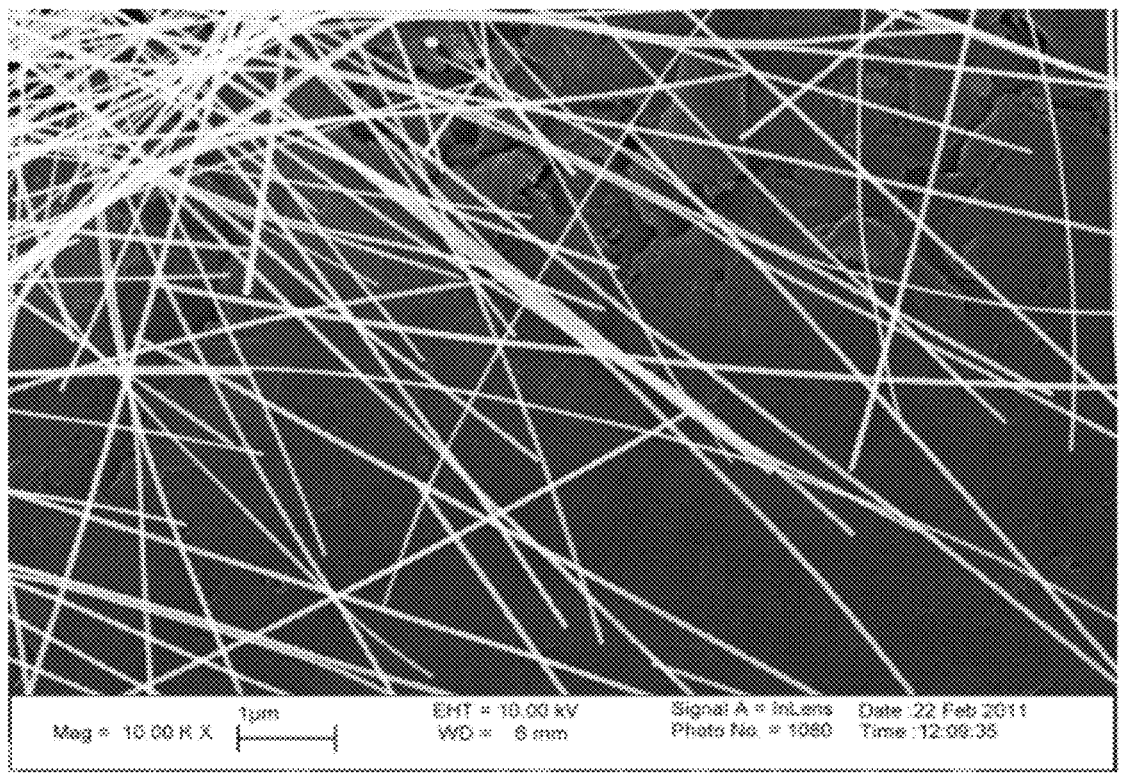
FIG. 18 shows a 10,000-power micrograph of the product of Example 20.

FIG. 17 shows an optical micrograph of a sample of the reaction mixture just after adding the silver nitrate solution. FIG. 18 shows a 10,000-power micrograph of the product.

Example 21 (Comparative)

To a 100 mL reaction flask containing 20 mL EG, 0.668 g PVP, 55.5 mg potassium bromide, and 0.128 mL of a 6 mM solution of $FeCl_2$ in EG were added at room temperature. The flask was then heated to 145-160° C. under nitrogen. 50.0 mg AgCl was then added to the flask. 7.5 mL of a 0.094 M solution of $AgNO_3$ in 60 mL EG, which had been degassed by bubbling nitrogen through it, was then added to the reaction flask at a constant rate of 1.2 mL/min. After addition of the $AgNO_3$ solution, the flask was held at temperature for 60 min. The product comprised primarily nanoparticles.

Example 22

Figure 19:
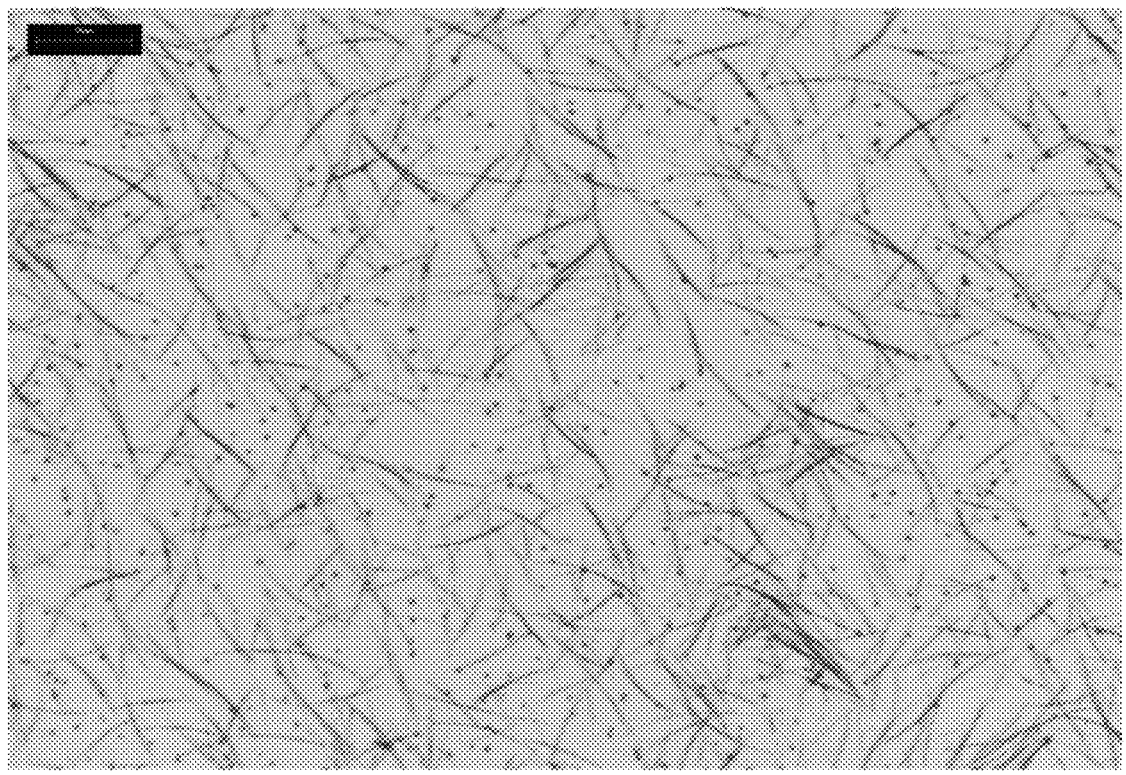
FIG. 19 shows an optical micrograph of the unpurified product of Example 22.

A 500 mL reaction flask containing 300 mL ethylene glycol (EG), 10.0 g polyvinylpyrrolidinone (PVP, 55,000 weight-average molecular weight), 161.1 mg sodium chloride, and 10 mg tin (II) bromide was heated to 160° C. while degassing by bubbling nitrogen through its contents. After the flask's contents reached 160° C., bubbling was discontinued and the reaction flask headspace was instead blanketed with nitrogen. A solution of 0.324 M $AgNO_3$ in EG, which had been degassed by bubbling nitrogen through it, was then added to the reaction flask at a constant rate of 1.2 mL/min for 42 min via a syringe needle. After addition of the $AgNO_3$ solution, the flask was held at temperature for 66 min, after which the reaction was quenched by immersing the flask in ice. FIG. 19 shows an optical micrograph of the unpurified reaction product.

Figure 20:
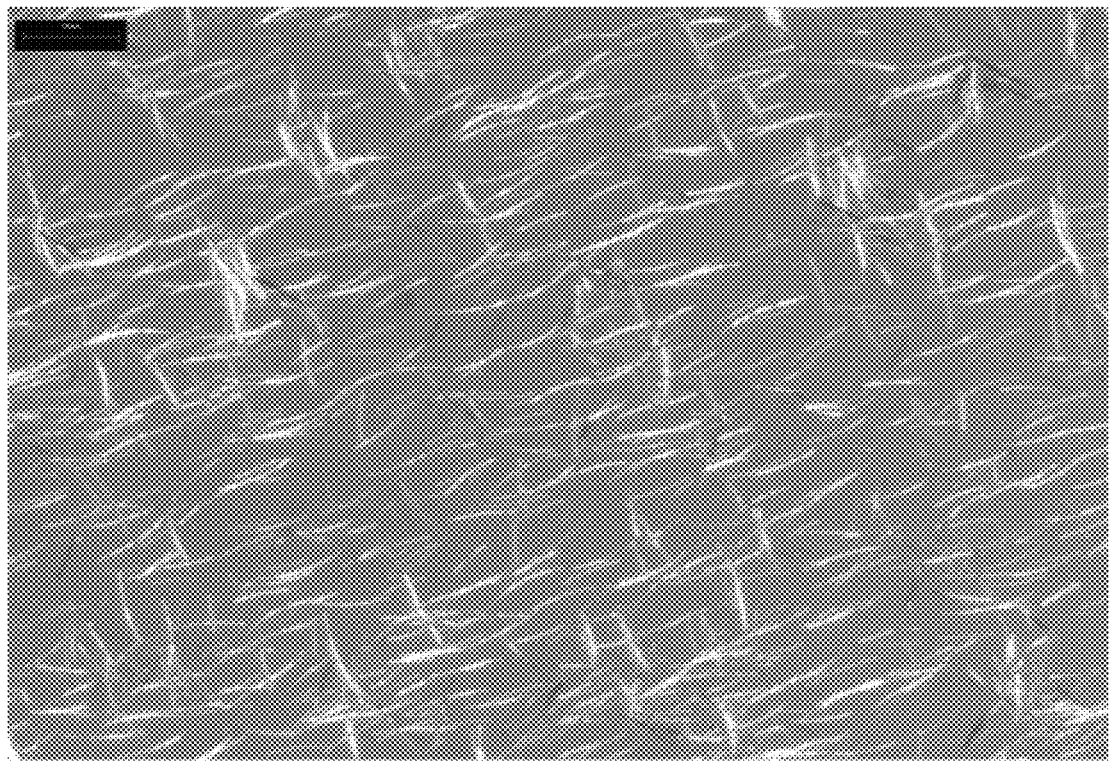
FIG. 20 shows an optical micrograph of the purified product of Example 22.
Figure 21:
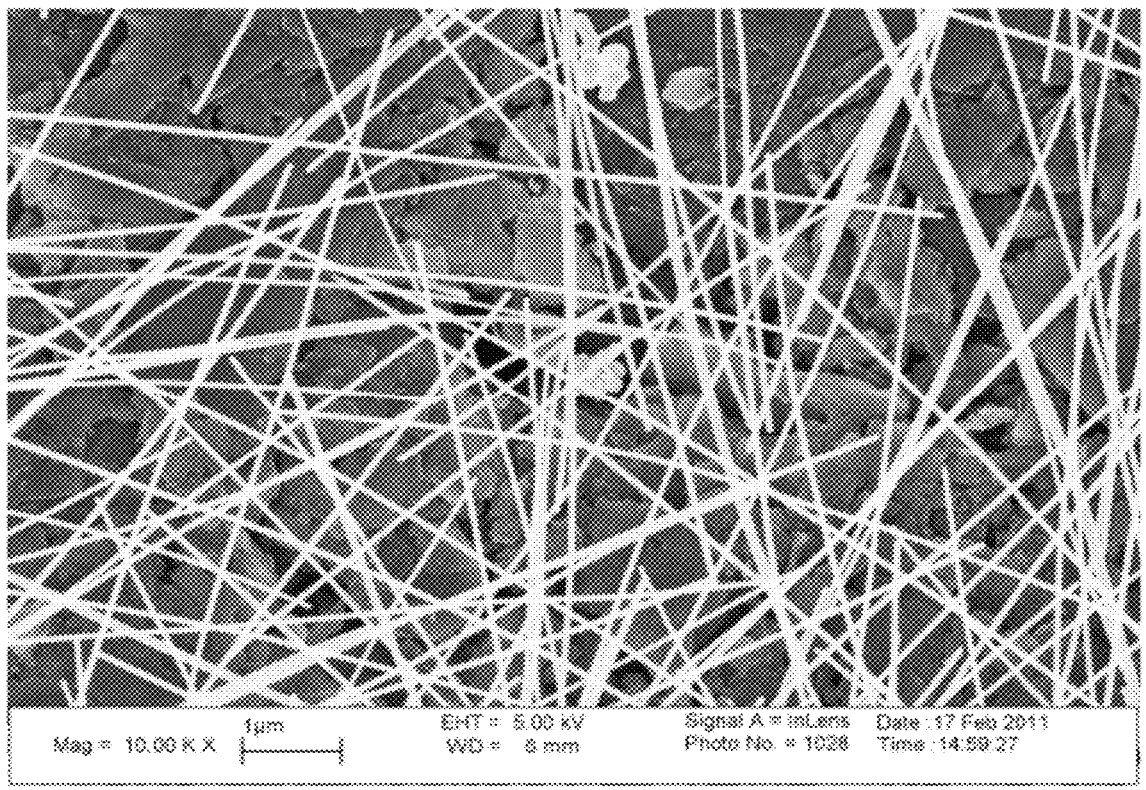
FIG. 21 shows a scanning electron micrograph of the purified product of Example 22.

The reaction product was then washed with acetone and isopropanol, then centrifuged to obtain the purified product silver nanowires. The average nanowire diameter was determined by scanning electron microscopy to be 65±11 nm, while the average nanowire length was determined to be 14.4±4.5 μm. FIG. 20 shows an optical micrograph of the purified product. FIG. 21 shows a scanning electron micrograph of the purified product.

Example 23

Figure 22:
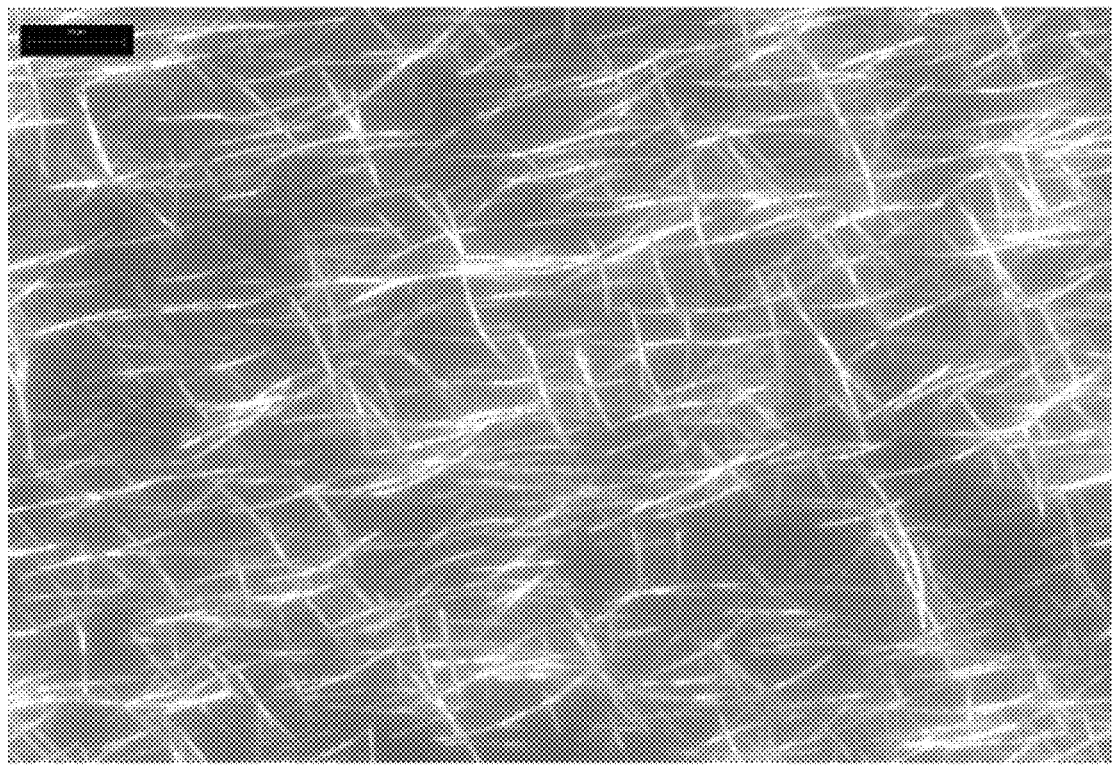
FIG. 22 shows an optical micrograph of the unpurified product of Example 23.
Figure 23:
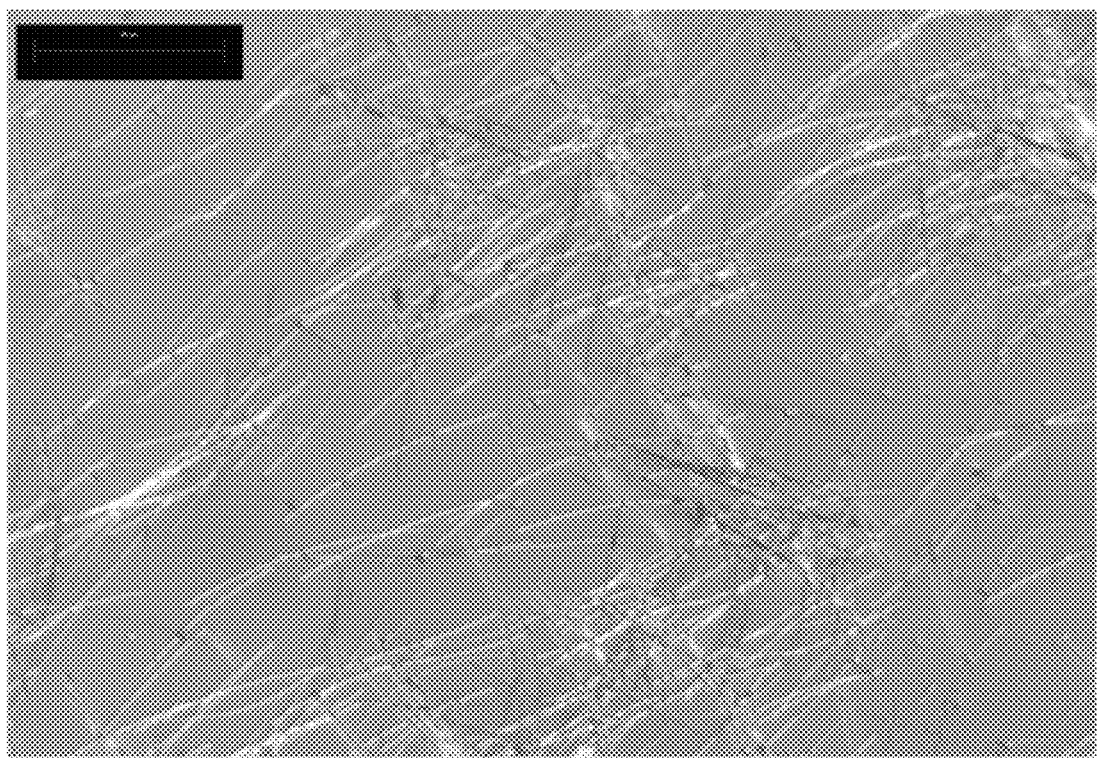
FIG. 23 shows large particles with the nanowire product of Example 23.

A 500 mL reaction flask containing 310 mL ethylene glycol (EG), 8.33 g PVP, 70.2 mg sodium chloride, and 10.1 mg tin (II) bromide was heated to 160° C. while degassing by bubbling nitrogen through its contents. After the flask's contents reached 160° C., bubbling was discontinued and the reaction flask headspace was instead blanketed with nitrogen. A solution of 0.324 M $AgNO_3$ in EG, which had been degassed by bubbling nitrogen through it, was then added to the reaction flask at a constant rate of 1.2 mL/min for 42 min via a syringe needle. After addition of the $AgNO_3$ solution, the flask was held at temperature for 11 min, after which the reaction was quenched by immersing the flask in ice. FIG. 22 shows an optical micrograph of the unpurified reaction product. Large particles were present with the nanowires, as shown in FIG. 23.

Figure 24:
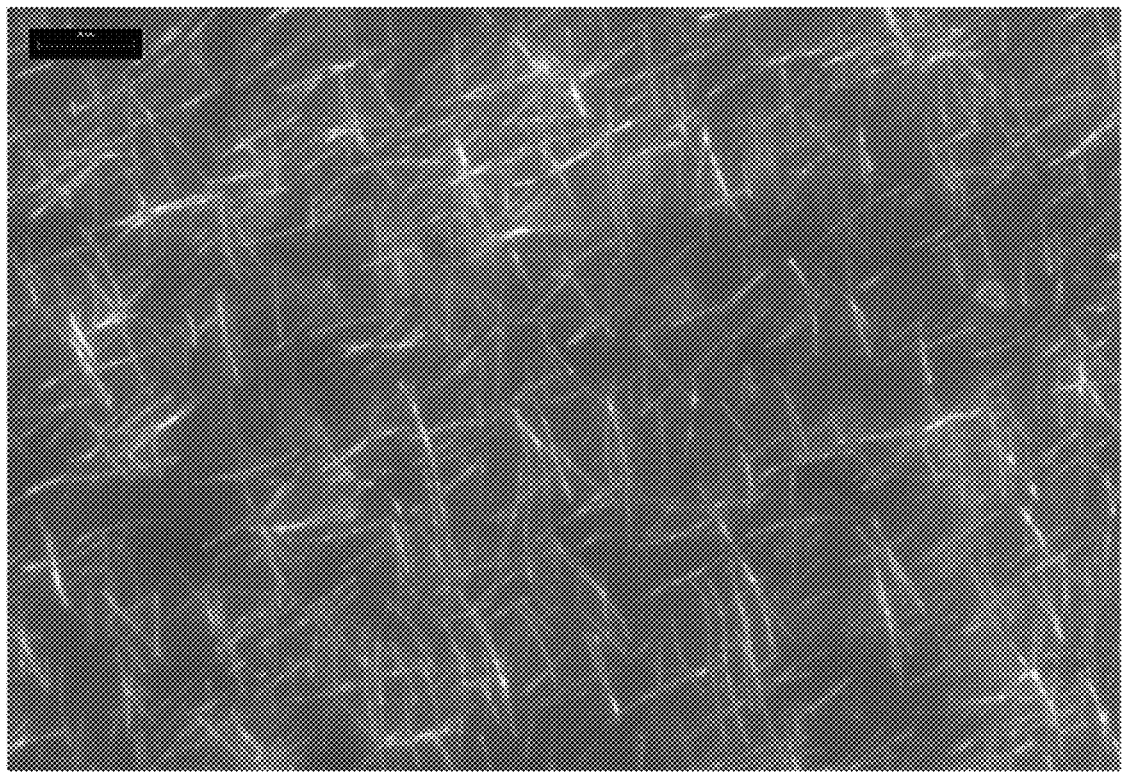
FIG. 24 shows an optical micrograph of the purified product of Example 23.
Figure 25:
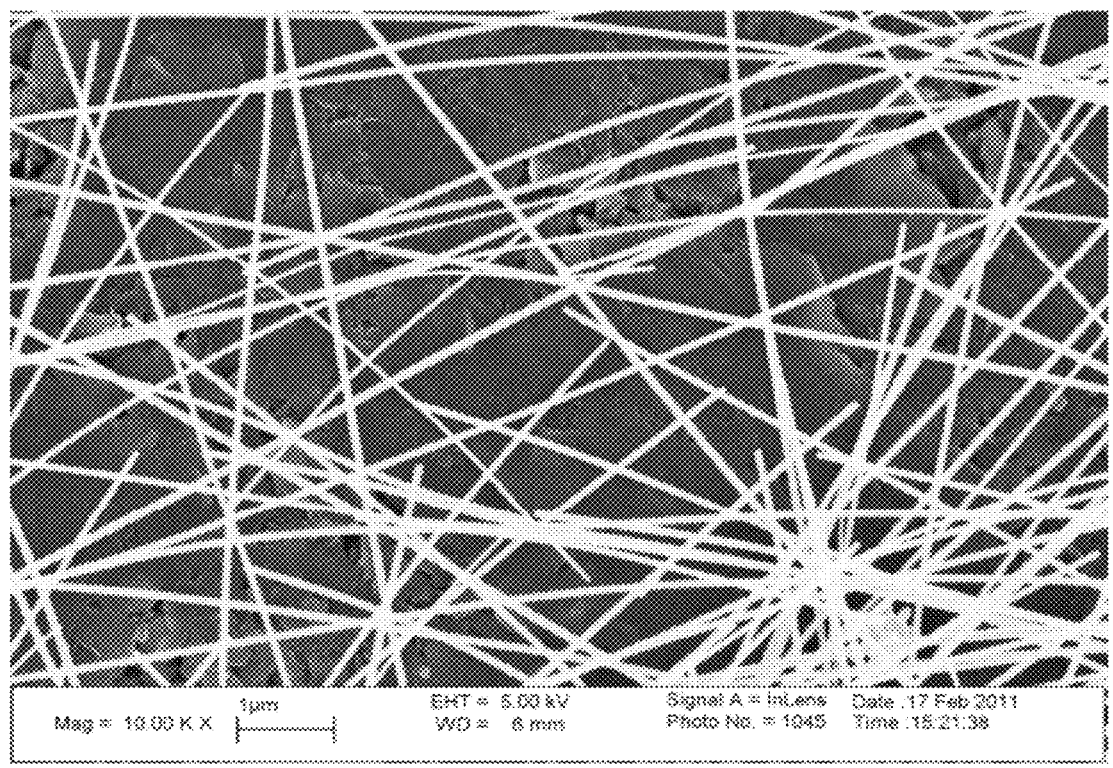
FIG. 25 shows a scanning electron micrograph of the purified product of Example 23.

The reaction product was then washed with acetone and isopropanol, then centrifuged to obtain the purified product silver nanowires. The average nanowire diameter was determined by scanning electron microscopy to be 80±15 nm, while the average nanowire length was determined to be 20±6 µm. FIG. 24 shows an optical micrograph of the purified product. FIG. 25 shows a scanning electron micrograph of the purified product.

Example 24

A 500 mL reaction flask containing 310 mL ethylene glycol (EG), 6.68 g PVP, 8.0 mg sodium chloride, and 10.3 mg tin (II) bromide was heated to 160° C. while degassing by bubbling nitrogen through its contents. After the flask's contents reached 160° C., bubbling was discontinued and the reaction flask headspace was instead blanketed with nitrogen. A solution of 0.324 M $AgNO_3$ in EG, which had been degassed by bubbling nitrogen through it, was then added to the reaction flask at a constant rate of 1.2 mL/min for 25 min via a syringe needle. After addition of the $AgNO_3$ solution, the flask was held at temperature for 120 min, after which the reaction was quenched by immersing the flask in ice.

Figure 26:
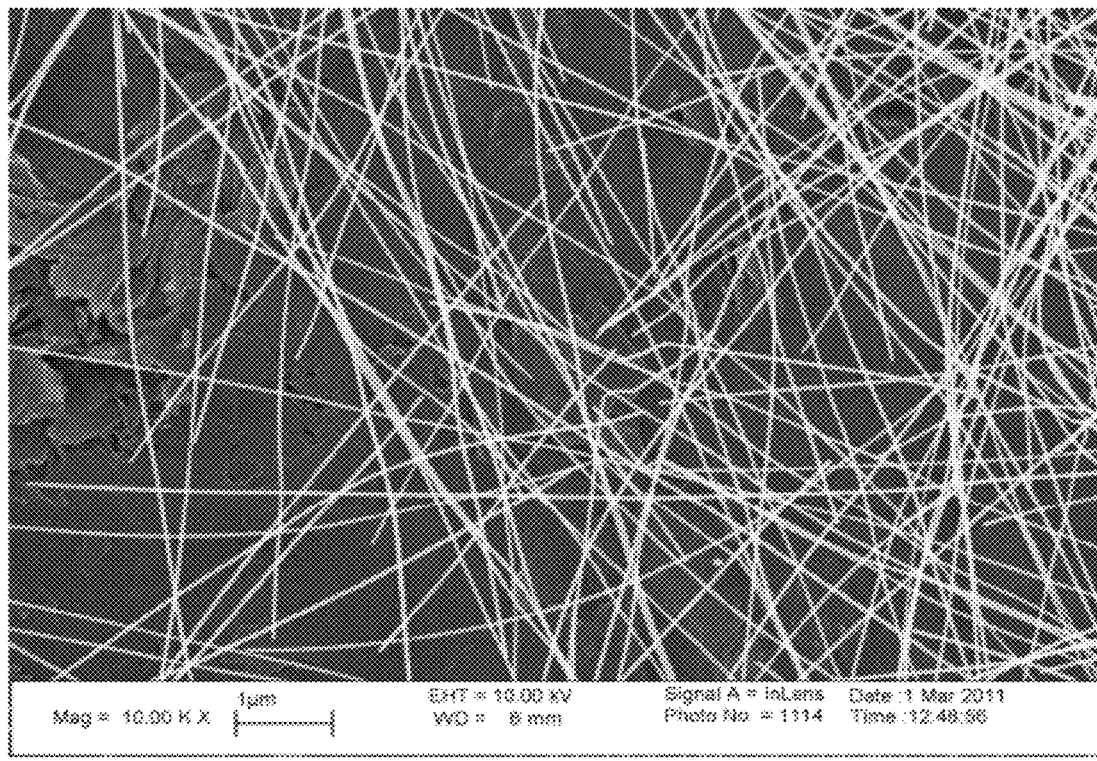
FIG. 26 shows a scanning electron micrograph of the purified product of Example 24.
Figure 27:
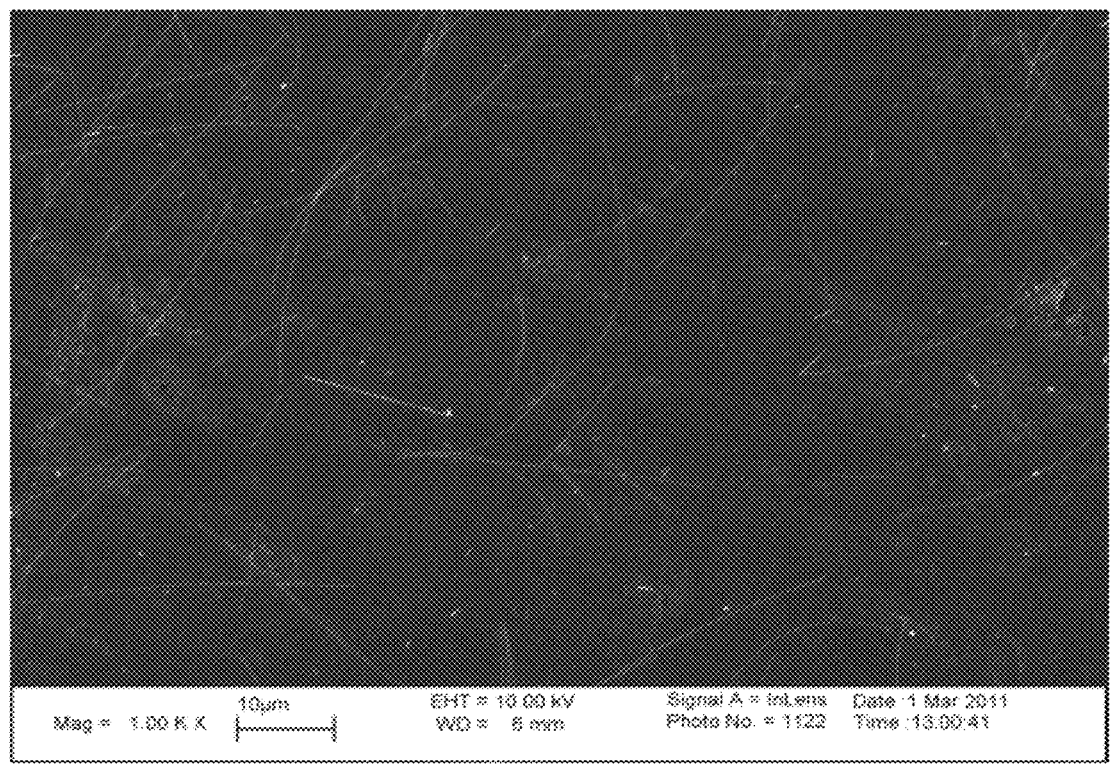
FIG. 27 shows a scanning electron micrograph of the purified product of Example 24.

The reaction product was then washed with acetone and isopropanol, then centrifuged to obtain the purified product silver nanowires. The average nanowire diameter was determined by scanning electron microscopy to be 43±15 nm, while the average nanowire length was determined to be 11±6 µm. FIGS. 26 and 27 show scanning electron micrographs of the purified product.

Example 25

A 500 mL reaction flask containing 470 mL ethylene glycol (EG), 5.0 g PVP, 9.8 mg sodium chloride, and 8.4 mg tin (II) bromide was heated to 160° C. while degassing by bubbling nitrogen through its contents. After the flask's contents reached 160° C., bubbling was discontinued and the reaction flask headspace was instead blanketed with nitrogen. A solution of 0.324 M $AgNO_3$ in EG, which had been degassed by bubbling nitrogen through it, was then added to the reaction flask at a constant rate of 1.0 mL/min for 30 min via a syringe needle. After addition of the $AgNO_3$ solution, the flask was held at temperature for 25 min, after which the reaction was quenched by immersing the flask in ice.

Figure 28:
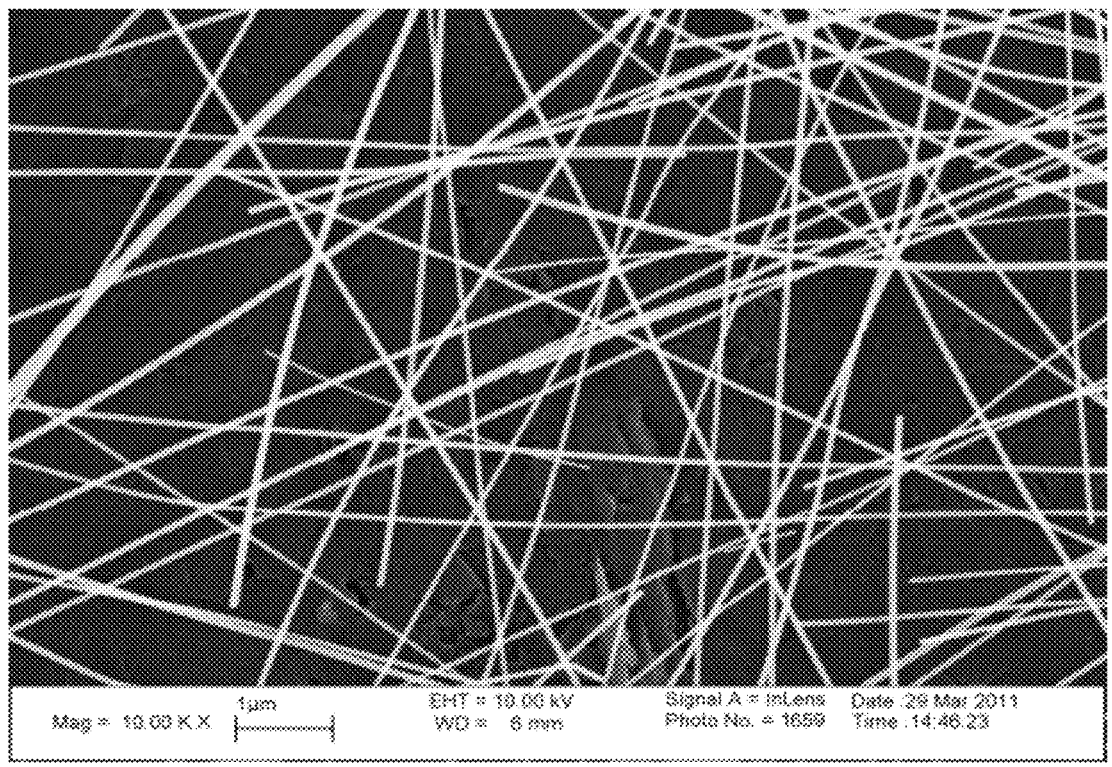
FIG. 28 shows a scanning electron micrograph of the purified product of Example 25.
Figure 29:
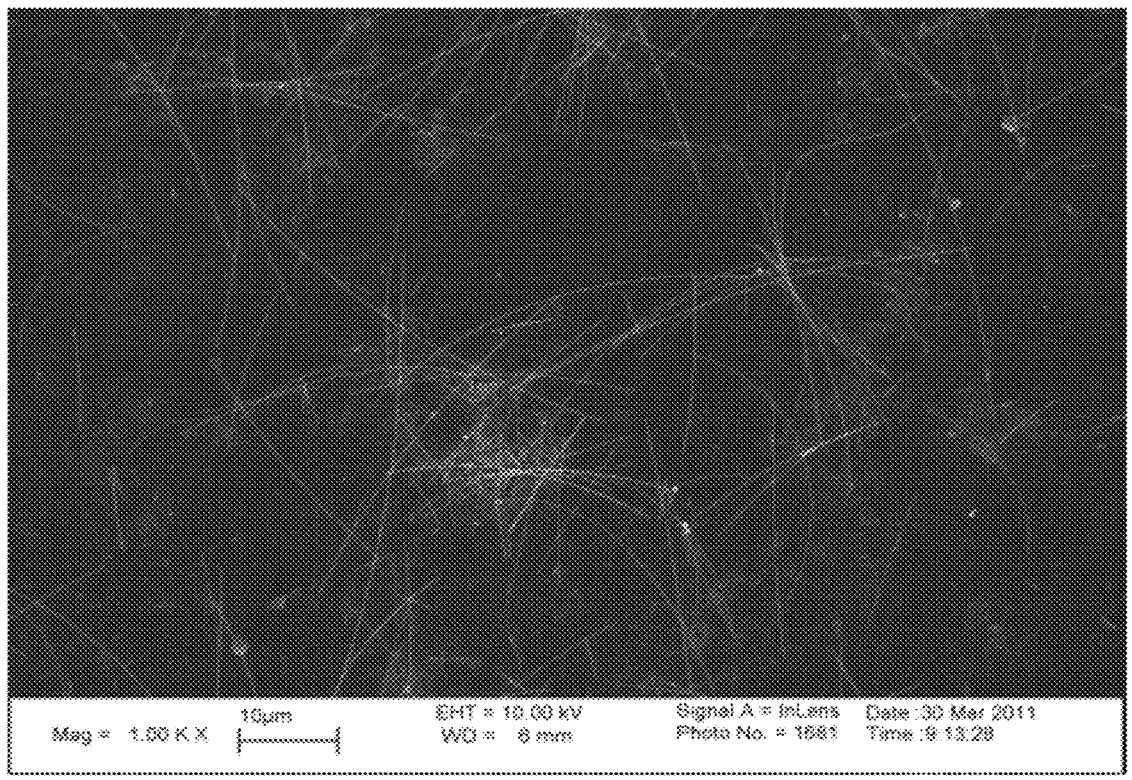
FIG. 29 shows a scanning electron micrograph of the purified product of Example 25.

The reaction product was then washed with acetone and isopropanol, then centrifuged to obtain the purified product silver nanowires. The average nanowire diameter was determined by scanning electron microscopy to be 66±15 nm, while the average nanowire length was determined to be 30±16 µm. FIGS. 28 and 29 show scanning electron micrographs of the purified product.

Example 26

A 500 mL reaction flask containing 470 mL ethylene glycol (EG), 5.0 g PVP, 14.9 mg sodium chloride, and 13.2 mg tin (II) bromide was heated to 160° C. while degassing by bubbling nitrogen through its contents. After the flask's contents reached 160° C., bubbling was discontinued and the reaction flask headspace was instead blanketed with nitrogen. A solution of 0.324 M $AgNO_3$ in EG, which had been degassed by bubbling nitrogen through it, was then added to the reaction flask at a constant rate of 1.0 mL/min for 30 min via a syringe needle. After addition of the $AgNO_3$ solution, the flask was held at temperature for 25 min, after which the reaction was quenched by immersing the flask in ice. The reaction product had few non-nanowire particles.

Figure 30:
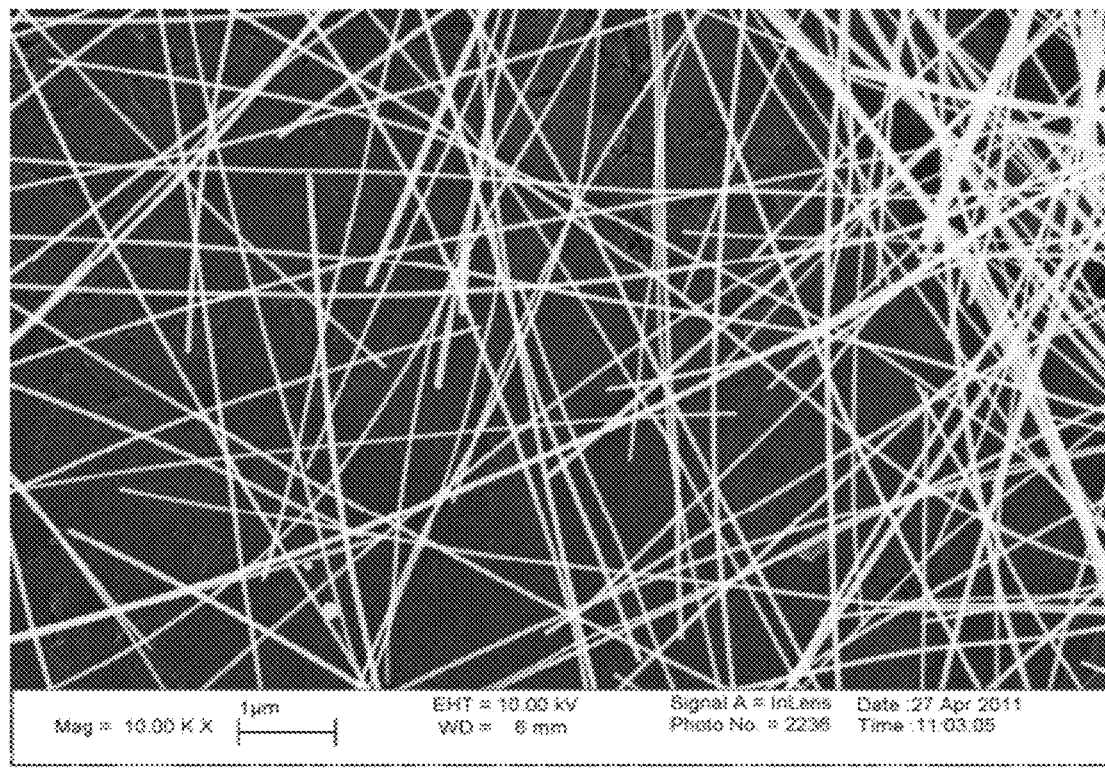
FIG. 30 shows a scanning electron micrograph of the purified product of Example 26.
Figure 31:
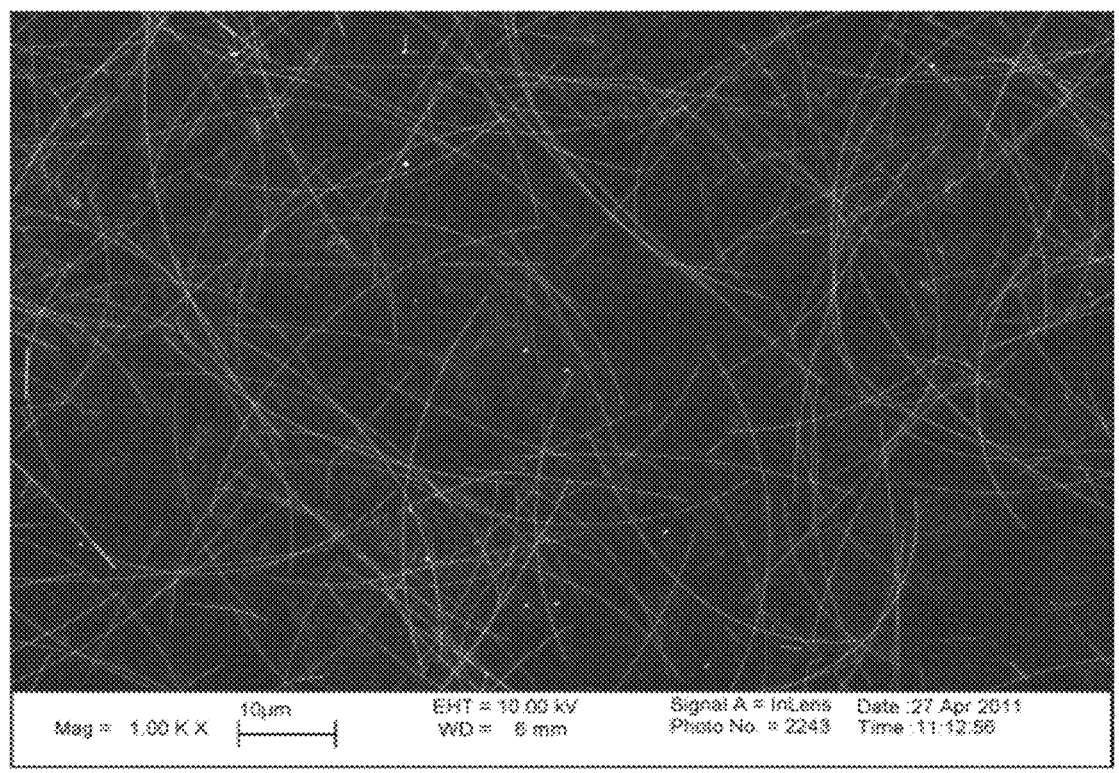
FIG. 31 shows a scanning electron micrograph of the purified product of Example 26.

The reaction product was then washed with acetone and isopropanol, then centrifuged to obtain the purified product silver nanowires. The average nanowire diameter was determined by scanning electron microscopy to be 53±15 nm, while the average nanowire length was determined to be 17±11 µm. FIGS. 30 and 31 show scanning electron micrographs of the purified product.

Example 27

A 500 mL reaction flask containing 470 mL ethylene glycol (EG), 5.0 g PVP, 9.8 mg sodium chloride, and 7.7 mg tin (II) bromide was heated to 160° C. while degassing by bubbling nitrogen through its contents. After the flask's contents reached 160° C., bubbling was discontinued and the reaction flask headspace was instead blanketed with nitrogen. A solution of 0.324 M $AgNO_3$ in EG, which had been degassed by bubbling nitrogen through it, was then added to the reaction flask at a constant rate of 1.0 mL/min for 30 min via a syringe needle. After addition of the $AgNO_3$ solution, the flask was held at temperature for 35 min, after which the reaction was quenched by immersing the flask in ice. The reaction product had few non-nanowire particles.

Figure 32:
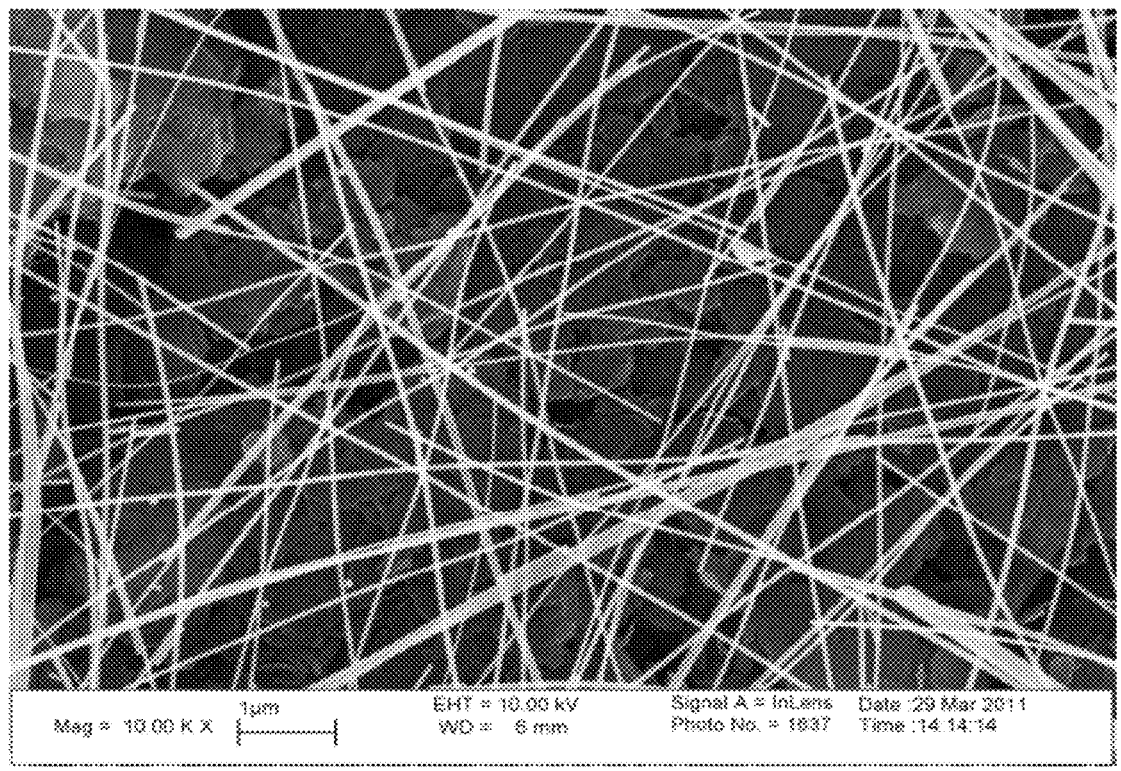
FIG. 32 shows a scanning electron micrograph of the purified product of Example 27.
Figure 33:
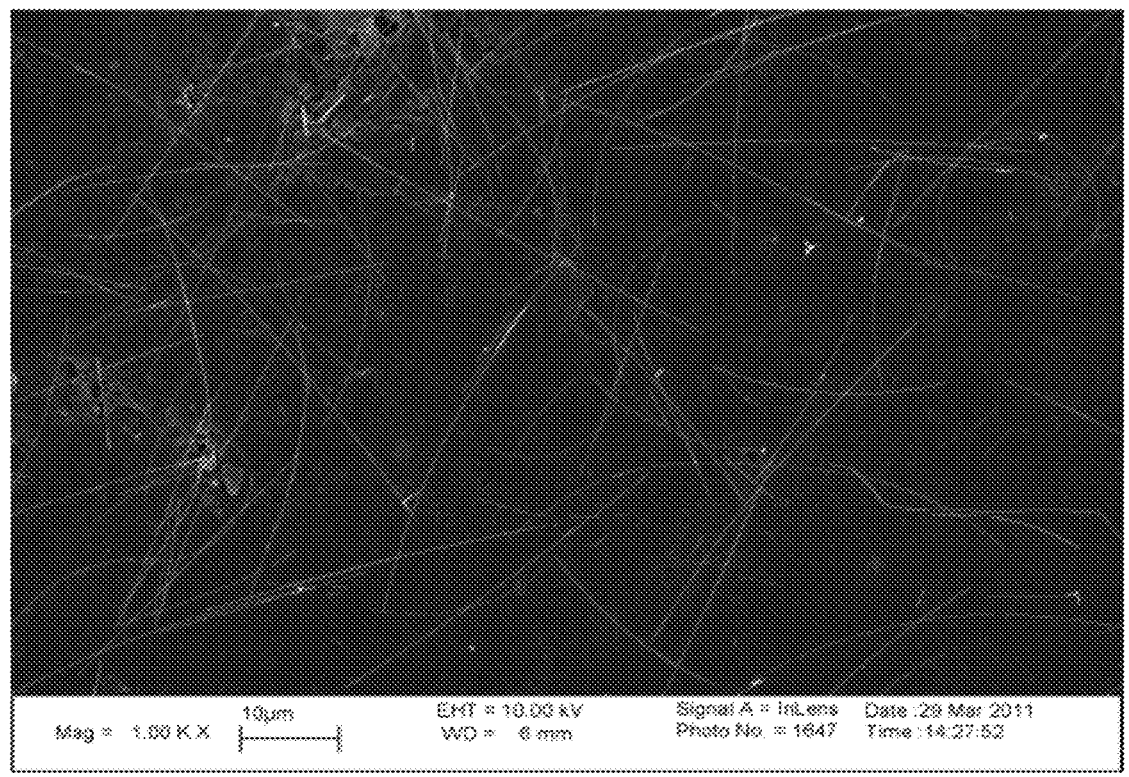
FIG. 33 shows a scanning electron micrograph of the purified product of Example 27.

The reaction product was then washed with acetone and isopropanol, then centrifuged to obtain the purified product silver nanowires. The yield of silver to silver nanowires was 89.8%. The average nanowire diameter was determined by scanning electron microscopy to be 51±14 nm, while the average nanowire length was determined to be 16±12 µm. FIGS. 32 and 33 show scanning electron micrographs of the purified product.

The invention has been described in detail with reference to particular embodiments, but it will be understood that variations and modifications can be effected within the spirit and scope of the invention. The presently disclosed embodiments are therefore considered in all respects to be illustrative and not restrictive. The scope of the invention is indicated by the appended claims, and all changes that come within the meaning and range of equivalents thereof are intended to be embraced therein.

What is claimed is:
1. A method comprising:
providing at least one first composition comprising a first molar quantity of at least one first reducible metal ion; and
reducing the at least one first reducible metal ion to at least one first metal nanowire in the presence of at least one bromide ion, at least one chloride ion, and a second molar quantity of at least one second metal ion comprising at least one tin ion, wherein the ratio of the second molar quantity to the first molar quantity is from about 0.0001 to about 0.1.

2. The method according to claim 1, wherein the at least one first reducible metal ion comprises at least one of a coinage metal ion, an ion of an IUPAC Group 11 element, or a silver ion.

3. The method according to claim 1, wherein the at least one second metal ion is in its +2 oxidation state.

4. The method according to claim 1, further comprising providing a first compound comprising at least one chlorine atom and at least one second compound comprising at least one bromine atom, wherein the molar ratio of the at least one chlorine atom to the at least one bromine atom is at least about 2.2 and less than about 38.4.

5. The method according to claim 1, further comprising providing a first compound comprising at least one chlorine atom and at least one second compound comprising at least one bromine atom, wherein the molar ratio of the at least one chlorine atom to the at least one bromine atom is at least about 2.4 and less than about 3.1.

6. The method according to claim 1, wherein the at least one first metal nanowire comprises one or more silver nanowires.

7. The method according to claim 1, wherein the at least one first metal nanowire consists essentially of one or more silver nanowires.

8. The method according to claim 1, wherein the at least one first metal nanowire comprises one or more silver nanowires having an aspect ratio from about 50 to about 10,000.

\* \* \* \* \*